United States Patent
Wakatsuki et al.

(10) Patent No.: US 9,831,125 B2
(45) Date of Patent: Nov. 28, 2017

(54) METHOD FOR MANUFACTURING SEMICONDUCTOR DEVICE

(71) Applicant: KABUSHIKI KAISHA TOSHIBA, Tokyo (JP)

(72) Inventors: Satoshi Wakatsuki, Mie (JP); Hiroshi Nakazawa, Oita (JP); Atsuko Sakata, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/131,704

(22) Filed: Apr. 18, 2016

(65) Prior Publication Data
US 2017/0170069 A1 Jun. 15, 2017

Related U.S. Application Data

(60) Provisional application No. 62/266,936, filed on Dec. 14, 2015.

(51) Int. Cl.
*H01L 21/76* (2006.01)
*H01L 21/768* (2006.01)

(52) U.S. Cl.
CPC .... *H01L 21/76897* (2013.01); *H01L 21/7682* (2013.01); *H01L 21/76883* (2013.01); *H01L 21/76886* (2013.01)

(58) Field of Classification Search
CPC .................................................. H01L 27/1157
See application file for complete search history.

(56) References Cited

U.S. PATENT DOCUMENTS

| | | | |
|---|---|---|---|
| 7,927,967 B2 | 4/2011 | Nomura et al. | |
| 8,013,383 B2 | 9/2011 | Kidoh et al. | |
| 8,258,033 B2 | 9/2012 | Watanabe | |
| 8,618,603 B2 | 12/2013 | Ozawa et al. | |
| 8,653,579 B2 | 2/2014 | Matsunami et al. | |
| 9,136,275 B2 * | 9/2015 | Yoo ................... | H01L 27/11556 |
| 9,450,023 B1 * | 9/2016 | Konevecki .......... | H01L 27/2454 |
| 9,570,464 B1 * | 2/2017 | Wakatsuki ........ | H01L 27/11582 |
| 2013/0032873 A1 * | 2/2013 | Kiyotoshi ......... | H01L 27/11582 257/324 |
| 2014/0175530 A1 * | 6/2014 | Chien ............... | H01L 29/66825 257/321 |
| 2014/0225181 A1 * | 8/2014 | Makala ............. | H01L 29/7889 257/321 |

(Continued)

FOREIGN PATENT DOCUMENTS

JP 2011-119510 6/2011

*Primary Examiner* — Caridad Everhart
*Assistant Examiner* — Ankush Singal
(74) *Attorney, Agent, or Firm* — Finnegan, Henderson, Farabow, Garrett & Dunner, L.L.P.

(57) ABSTRACT

According to one embodiment, a method for manufacturing a semiconductor device includes forming a silicon film on an upper surface side, a lower surface side, and a side surface side of an air gap, while leaving part of the air gap between the silicon film formed on the upper surface side and the silicon film formed on the lower surface side. The method includes forming a metal film on a side surface of the slit. The method includes forming a plurality of metal silicide layers between the second layers by causing reaction between the metal film and the silicon film. The method includes removing unreacted part of the metal film formed on the side surface of the slit.

20 Claims, 22 Drawing Sheets

(56) References Cited

U.S. PATENT DOCUMENTS

| | | | |
|---|---|---|---|
| 2014/0353738 A1* | 12/2014 | Makala | H01L 27/11551 257/321 |
| 2015/0060992 A1 | 3/2015 | Taekyung et al. | |
| 2016/0071871 A1* | 3/2016 | Kamigaichi | H01L 27/11582 257/314 |
| 2016/0118398 A1* | 4/2016 | Yon | H01L 27/11582 257/314 |
| 2016/0168704 A1* | 6/2016 | Choi | C23C 16/45578 156/345.33 |
| 2016/0225786 A1* | 8/2016 | Lee | H01L 27/11582 |
| 2016/0268191 A1* | 9/2016 | Hu | H01L 27/11582 |
| 2016/0268293 A1* | 9/2016 | Kamigaichi | H01L 27/11582 |
| 2016/0293618 A1* | 10/2016 | Namkoong | H01L 29/42344 |
| 2016/0358933 A1* | 12/2016 | Rabkin | H01L 27/11582 |
| 2017/0062455 A1* | 3/2017 | Nomura | H01L 27/11582 |
| 2017/0062460 A1* | 3/2017 | Nishida | H01L 27/11568 |
| 2017/0062464 A1* | 3/2017 | Aoyama | H01L 27/1157 |

* cited by examiner

METHOD FOR MANUFACTURING SEMICONDUCTOR DEVICE

CROSS-REFERENCE TO RELATED APPLICATION

This application is based upon and claims the benefit of priority from U.S. Provisional Patent Application 62/266,936, filed on Dec. 14, 2015; the entire contents of which are incorporated herein by reference.

FIELD

Embodiments described herein relate generally to a method for manufacturing a semiconductor device.

BACKGROUND

There is proposed a memory device of a three-dimensional structure in which a plurality of electrode layers are stacked with an insulator on a substrate. A proposed material of the electrode layer is metal silicide. Thermal reaction for forming metal silicide involves volume expansion. A process taking the volume expansion into consideration is required.

DETAILED DESCRIPTION

According to one embodiment, a method for manufacturing a semiconductor device includes forming a stacked body above a substrate. The stacked body includes a plurality of first layers and a plurality of second layers. The first and second layers include a first layer and a second layer alternately stacked. The method includes forming a slit extending in a stacking direction in the stacked body. The method includes removing the first layers by etching through the slit to form an air gap between the second layers. The air gap communicates with the slit. The method includes forming a silicon film on an upper surface side of the air gap, a lower surface side of the air gap, and a side surface side of the air gap, the side surface side being different from the slit side, while leaving part of the air gap between the silicon film formed on the upper surface side of the air gap and the silicon film formed on the lower surface side of the air gap. The method includes after the forming the silicon film, forming a metal film on a side surface of the slit. The method includes forming a plurality of metal silicide layers between the second layers by causing reaction between the metal film and the silicon film. The method includes removing unreacted part of the metal film formed on the side surface of the slit.

In the embodiment, the semiconductor device is described with reference to e.g. a semiconductor memory device including a memory cell array of a three-dimensional structure.

Figure 1:
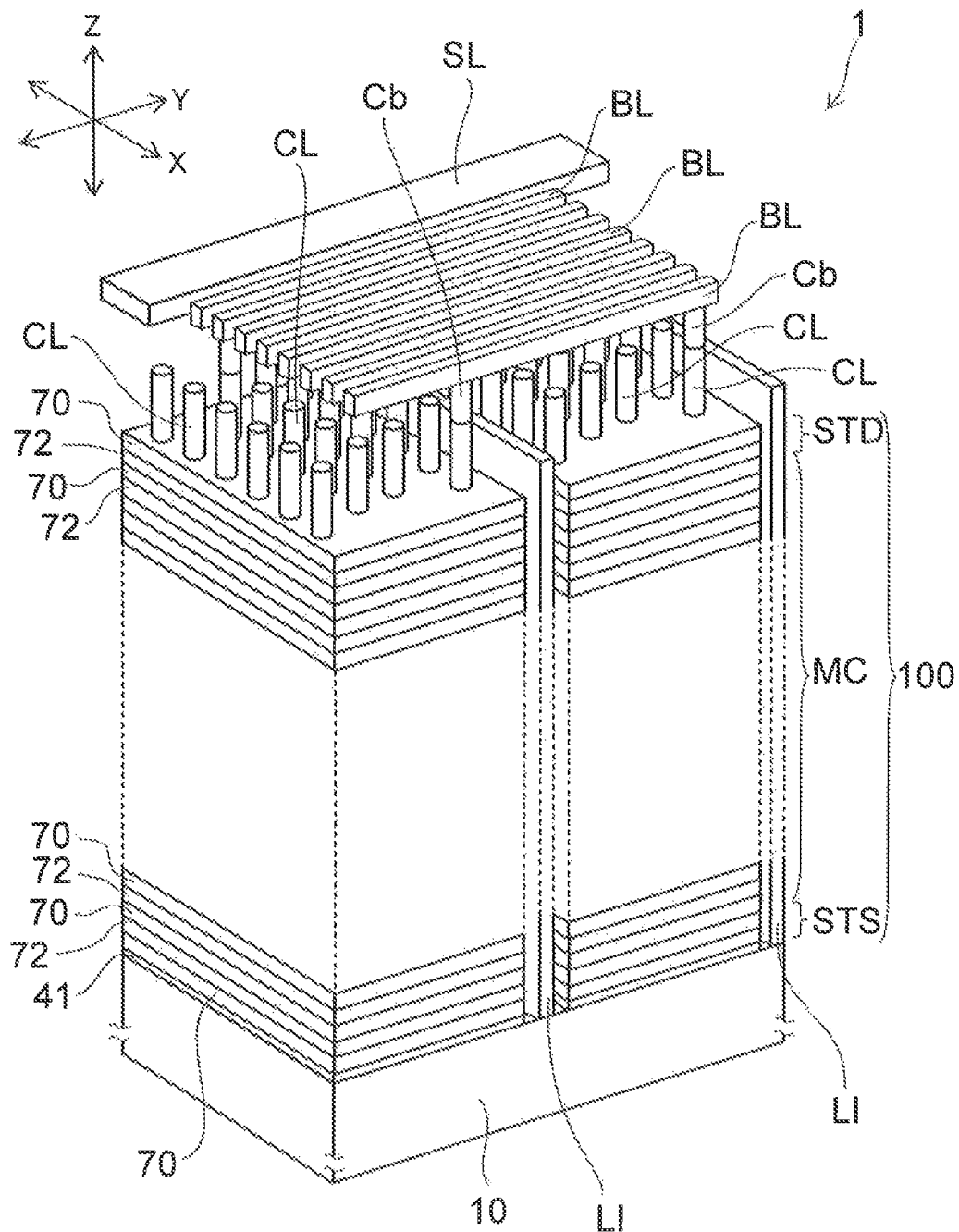
FIG. 1 is a schematic perspective view of a semiconductor device of an embodiment.

FIG. 1 is a schematic perspective view of the memory cell array 1 of the embodiment.

In FIG. 1, two directions parallel to the major surface of the substrate 10 and orthogonal to each other are referred to as X-direction and Y-direction. The direction orthogonal to both the X-direction and the Y-direction is referred to as Z-direction (stacking direction).

The memory cell array 1 includes a substrate 10, a stacked body 100 provided on the major surface of the substrate 10, a plurality of columnar parts CL, a plurality of interconnect parts LI, and an upper interconnect provided above the stacked body 100. FIG. 1 shows e.g. bit lines BL and a source line SL as the upper interconnect.

The columnar part CL is formed like a circular column or elliptical column extending in the stacking direction (Z-direction) in the stacked body 100. The interconnect part LI spreads in the stacking direction (Z-direction) and the X-direction of the stacked body 100. The interconnect part LI separates the stacked body 100 into a plurality of blocks (or fingers) in the Y-direction.

The plurality of columnar parts CL are arranged in e.g. a staggered arrangement. Alternatively, the plurality of columnar parts CL may be arranged in a square lattice along the X-direction and the Y-direction.

A plurality of bit lines BL are provided above the stacked body 100. The plurality of bit lines BL are e.g. metal films extending in the Y-direction. The plurality of bit lines BL are separated from each other in the X-direction, The upper end of the semiconductor body, described later, of the columnar part CL is connected to the bit line BL through a contact part Cb. A plurality of columnar parts CL are connected to one common bit line BL. The plurality of columnar parts CL connected to the common bit line BL include columnar parts CL each selected from one of the blocks separated in the Y-direction by the interconnect part LI.

Figure 2:
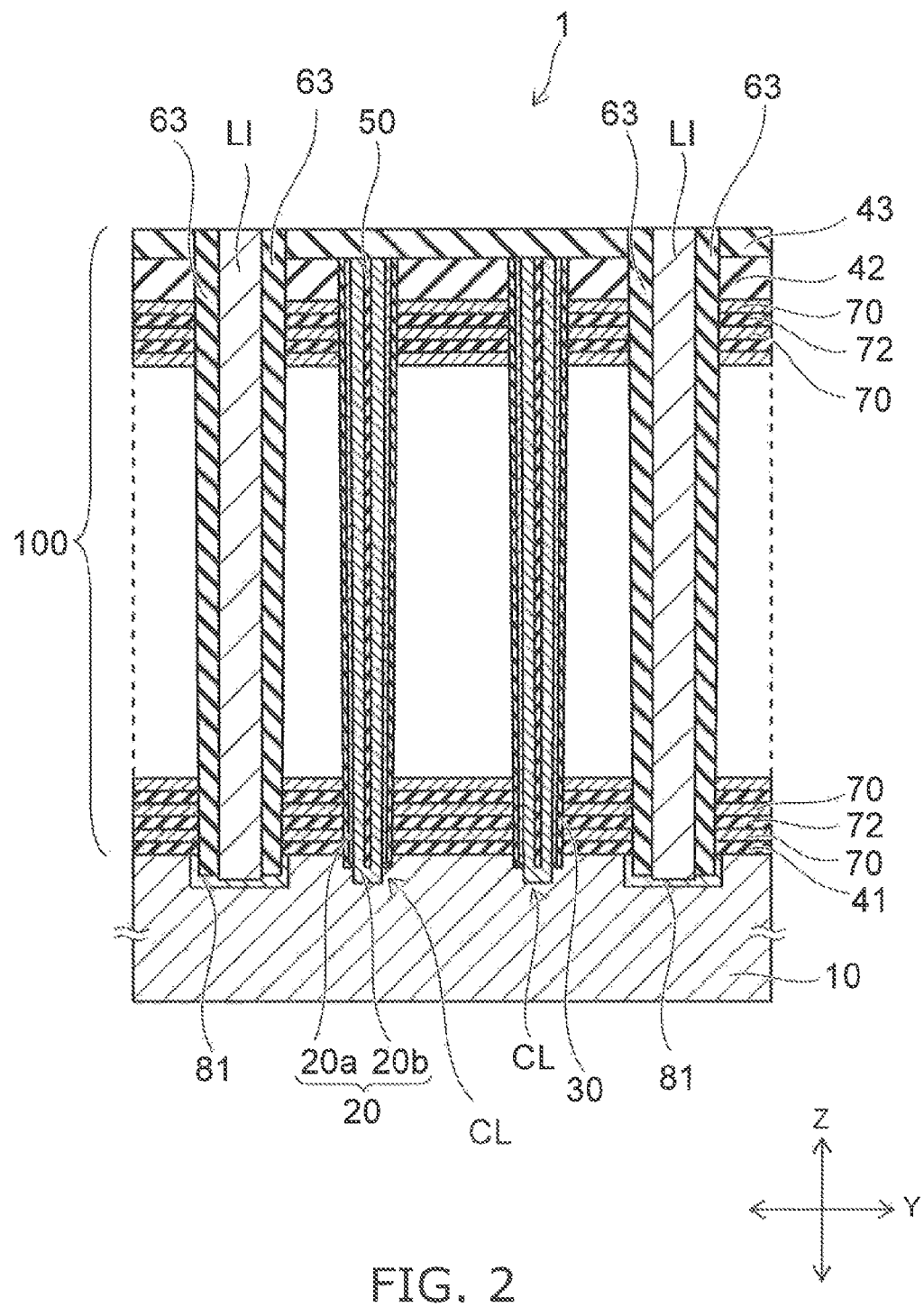
FIG. 2 is a schematic sectional view of the semiconductor device of the embodiment.

FIG. 2 is a schematic sectional view of the memory cell array 1. The Y-direction and the Z-direction shown in FIG. 2 correspond to the Y-direction and the Z-direction shown in FIG. 1, respectively.

The stacked body 100 includes a plurality of metal silicide layers 70 stacked on the major surface of the substrate 10. The plurality of metal silicide layers 70 are stacked in the direction (Z-direction) perpendicular to the major surface of the substrate 10 with an insulating layer 72 interposed.

An insulating film 41 is provided between the major surface of the substrate 10 and the lowermost metal silicide layer 70. An insulating film 42 is provided on the uppermost metal silicide layer 70. An insulating film 43 is provided on the insulating film 42.

The columnar part CL includes a memory film 30, a semiconductor body 20, and an insulating core film 50. The semiconductor body 20, the memory film 30, and the core film 50 extend continuously along the stacking direction of the stacked body 100.

The semiconductor body 20 extends like a pipe in the stacking direction (Z-direction) in the stacked body 100. The memory film 30 is provided between the metal silicide layer 70 and the semiconductor body 20. The memory film 30 surrounds the semiconductor body 20 from the outer peripheral side. The core film 50 is provided inside the pipe-shaped semiconductor body 20. The upper end of the semiconductor body 20 is connected to the bit line BL through the contact part Cb shown in FIG. 1.

Figure 3:
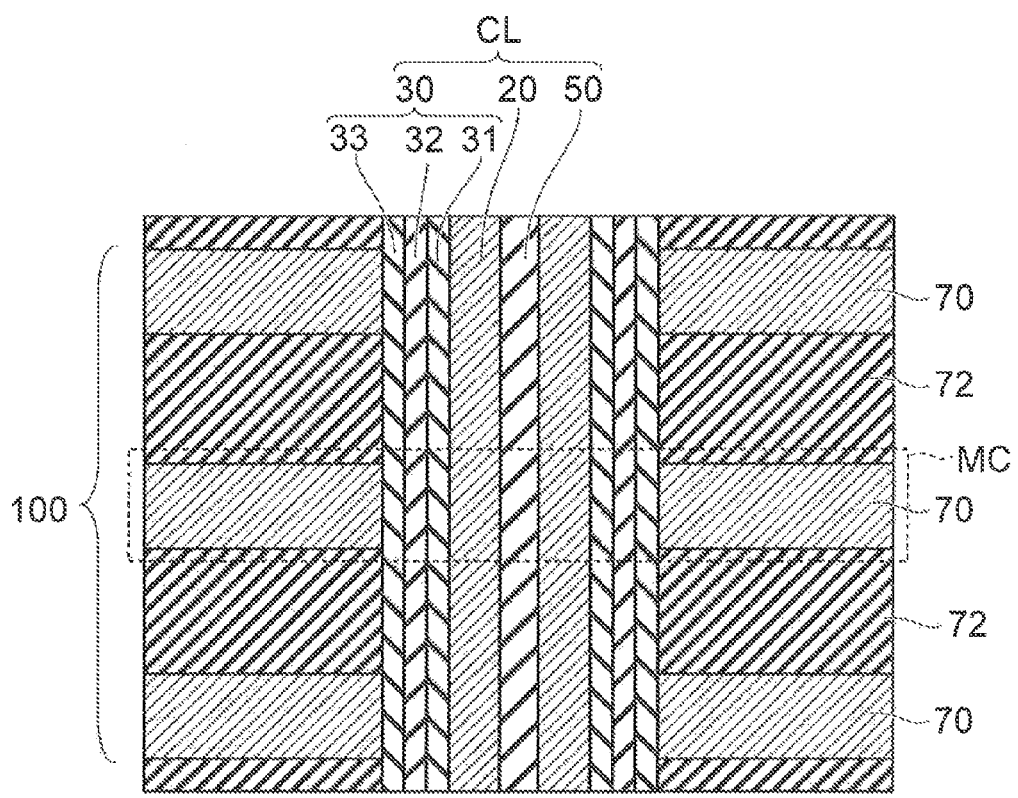
FIG. 3 is an enlarged sectional view of a portion of FIG. 2.

FIG. 3 is an enlarged sectional view of a portion of FIG. 2.

The memory film 30 is a stacked film including a tunnel insulating film 31, a charge storage film (charge storage part) 32, and a block insulating film 33. The block insulating film 33, the charge storage film 32, and the tunnel insulating film 31 are provided between the metal silicide layer 70 and the semiconductor body 20 sequentially from the metal silicide layer 70 side. The tunnel insulating film 31 is in contact with the semiconductor body 20. The block insulating film 33 is in contact with the metal silicide layer 70. The charge storage film 32 is provided between the block insulating film 33 and the tunnel insulating film 31.

The semiconductor body 20, the memory film 30, and the metal silicide layer 70 constitute a memory cell MC. In FIG. 3, one memory cell MC is schematically shown by the dashed line. The memory cell MC has a vertical transistor structure in which the semiconductor body 20 is surrounded with the metal silicide layer 70 via the memory film 30. The memory film 30 is provided between the inner peripheral surface of the metal silicide layer 70 and the outer peripheral surface of the semiconductor body 20 continuously in the direction connecting the inner peripheral surface of the metal silicide layer 70 and the outer peripheral surface of the semiconductor body 20.

In the memory cell MC having the vertical transistor structure, the semiconductor body 20 is e.g. a channel body of silicon. The metal silicide layer 70 functions as a control gate. The charge storage film 32 functions as a data storage layer for storing charge injected from the semiconductor body 20.

The semiconductor memory device of the embodiment is a nonvolatile semiconductor memory device capable of electrically and freely erasing/writing data and retaining its memory content even when powered off.

The memory cell MC is e.g. a charge trap type memory cell. The charge storage film 32 includes a large number of trap sites for trapping charge in the insulating film, and includes e.g. silicon nitride film. Alternatively, the charge storage film 32 may be a conductive floating gate surrounded with an insulator.

The tunnel insulating film 31 serves as a potential barrier when charge is injected from the semiconductor body 20 into the charge storage film 32, or when the charge stored in the charge storage film 32 is released into the semiconductor body 20. The tunnel insulating film 31 includes e.g. silicon oxide film.

The block insulating film 33 prevents the charge stored in the charge storage film 32 from being released into the metal silicide layer 70. The block insulating film 33 suppresses back tunneling of electrons from the metal silicide layer 70 into the columnar part CL.

The block insulating film 33 includes e.g. silicon oxide film. Alternatively, the block insulating film 33 is a stacked film of a silicon oxide film and a film (e.g., metal oxide film) having higher dielectric constant than silicon oxide film. The film having higher dielectric constant may be provided on the metal silicide layer 70 side. A silicon oxide film may be provided between the film having higher dielectric constant and the charge storage film 32.

As shown in FIG. 1, a drain side select transistor STD is provided in the upper layer part of the stacked body 100 (the upper end part of the columnar part CL). A source side select transistor STS is provided in the lower layer part of the stacked body 100 (the lower end part of the columnar part CL). For instance, the uppermost metal silicide layer 70 functions as a control gate of the drain side select transistor STD. For instance, the lowermost metal silicide layer 70 functions as a control gate of the source side select transistor STS.

A plurality of memory cells MC are provided between the drain side select transistor STD and the source side select transistor STS. The memory cells MC, the drain side select transistor STD, and the source side select transistor STS are series connected through the semiconductor body 20 and constitute one memory string. Such memory strings are arranged in e.g. a staggered arrangement in the plane direction parallel to the X-Y plane. Thus, the plurality of memory cells MC are provided three-dimensionally in the X-direction, the Y-direction, and the Z-direction.

As shown in FIG. 1, the interconnect part LI spreads in the X-direction and the Z-direction. The interconnect part LI is e.g. a metal-containing film. As shown in FIG. 2, an insulating film 63 is provided on the side surface of the interconnect part LI. The insulating film 63 is provided between the stacked body 100 and the interconnect part LI.

The lower end of the interconnect part LI is in contact with the substrate 10. The lower end of the semiconductor body 20 is in contact with the substrate 10. The substrate 10 is e.g. a silicon substrate doped with impurity and having conductivity.

A semiconductor region 81 is formed in the surface of the substrate 10 to which the lower end of the interconnect part LI extends. A plurality of semiconductor regions 81 are provided corresponding to the plurality of interconnect parts LI. The plurality of semiconductor regions 81 include p-type semiconductor regions 81 and n-type semiconductor regions 81. The p-type semiconductor region 81 supplies holes to the semiconductor body 20 through the substrate 10 at the time of erase operation. At the time of read operation, electrons are supplied from the interconnect part LI through the n-type semiconductor region 81 and the substrate 10 to the semiconductor body 20.

By controlling the potential applied to the lowermost metal silicide layer 70 provided on the surface (major surface) of the substrate 10 via the insulating film 41, a channel is induced in the surface of the substrate 10 between the semiconductor region 81 and the lower end of the semiconductor body 20. Thus, a current can be passed between the semiconductor region 81 and the lower end of the semiconductor body 20.

The lowermost metal silicide layer 70 functions as a control gate for inducing a channel in the surface of the substrate 10. The insulating film 41 functions as a gate insulating film.

The metal silicide layer 70 is e.g. a nickel silicide layer. This nickel silicide layer primarily contains e.g. NiSi or $Ni_2Si$.

Increasing the density of the memory cells MC requires increasing the number of stacked metal silicide layers 70. Furthermore, it is desirable to suppress the increase of the total thickness of the stacked body 100 from the viewpoint of facilitating processing the stacked body 100. Thus, thinning the individual metal silicide layer 70 may be required with the increase of the number of stacked metal silicide layers 70.

Nickel silicide exhibits more gradual increase in resistivity with thinning than metals such as tungsten. Nickel silicide is less susceptible to the narrow line effect. Such a nickel silicide is suitable for the material of the thinned metal silicide layer 70.

Next, a method for manufacturing a semiconductor device of the embodiment is described with reference to FIGS. 4 to 23. FIGS. 17A to 22B show an enlarged cross section of a portion of the stacked body 100.

Figure 4:
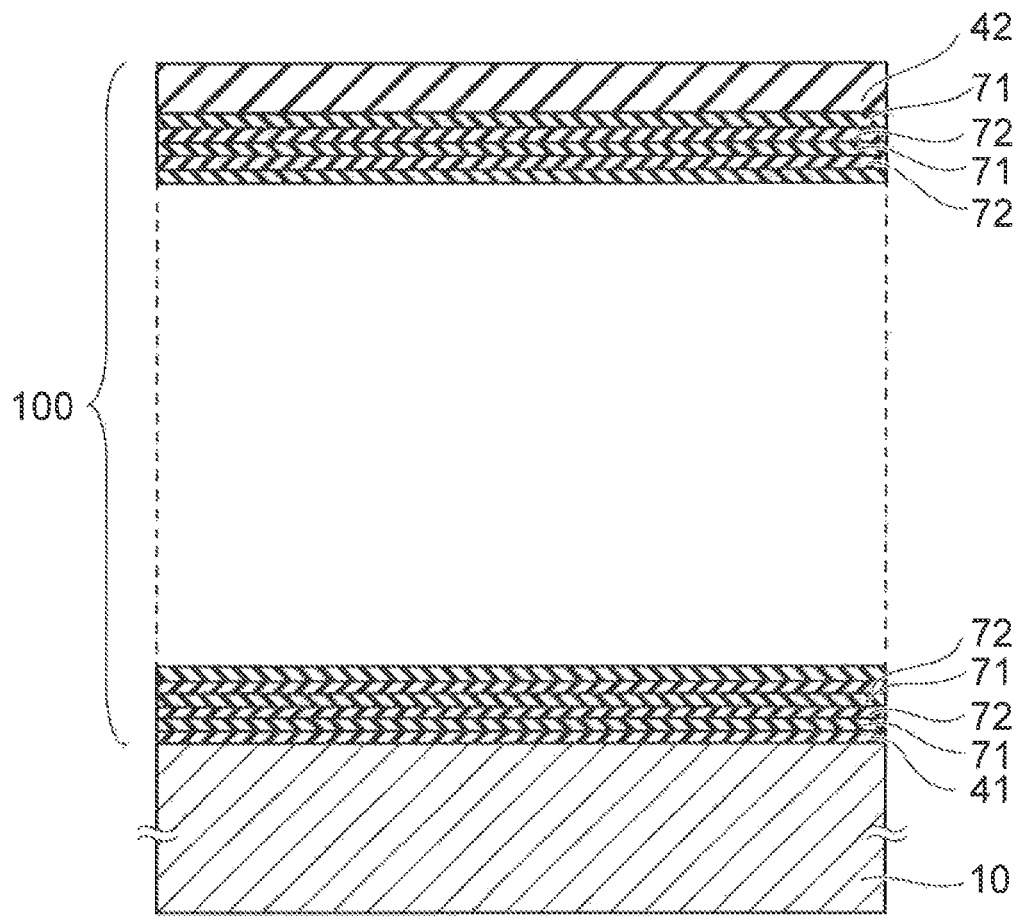
FIGS. 4 to 23 are schematic cross-sectional views showing a method for manufacturing the semiconductor device of the embodiment.

As shown in FIG. 4, a stacked body 100 is formed on a substrate 10. An insulating film 41 is formed on the major surface (front surface) of the substrate 10. A sacrificial layer 71 as a first layer and an insulating layer 72 as a second layer are alternately stacked on the insulating film 41. The step of alternately stacking the sacrificial layer 71 and the insulating layer 72 is repeated to form a plurality of sacrificial layers 71 and a plurality of insulating layers 72 on the substrate 10. For instance, the sacrificial layer 71 is a silicon nitride layer, and the insulating layer 72 is a silicon oxide layer.

The lowermost sacrificial layer 71 is formed on the insulating film 41. The lowermost insulating layer 72 is formed on the lowermost sacrificial layer 71. An insulating film 42 is formed on the uppermost sacrificial layer 71.

Figure 5:
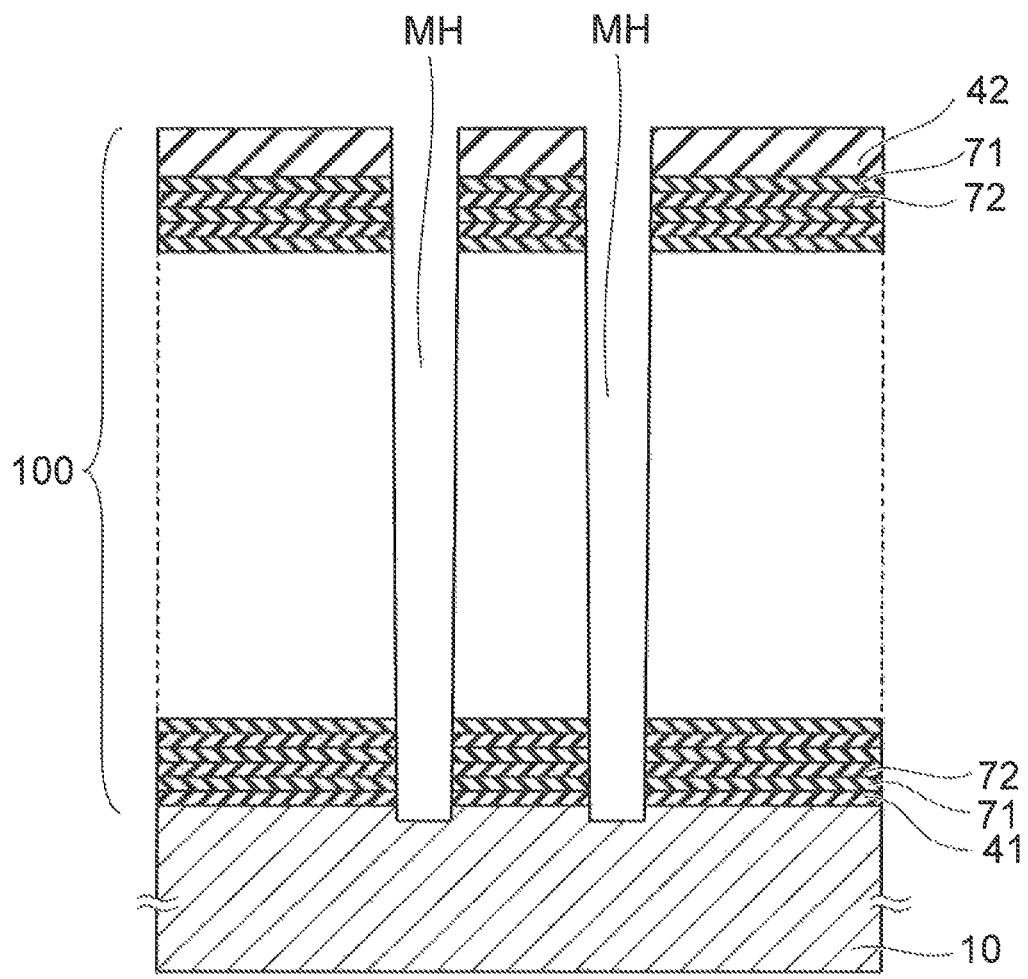

As shown in FIG. 5, a plurality of memory holes MH are formed in the stacked body 100. The memory holes MH are formed by reactive ion etching (RIE) technique using a mask, not shown. The memory hole MH penetrates through the stacked body 100 to the substrate 10.

A plurality of sacrificial layers (silicon nitride layers) 71 and a plurality of insulating layers (silicon oxide layers) 72 are continuously etched by RIE technique using e.g. fluorine-containing gas without switching the gas. This enables processing with high throughput.

Figure 6:
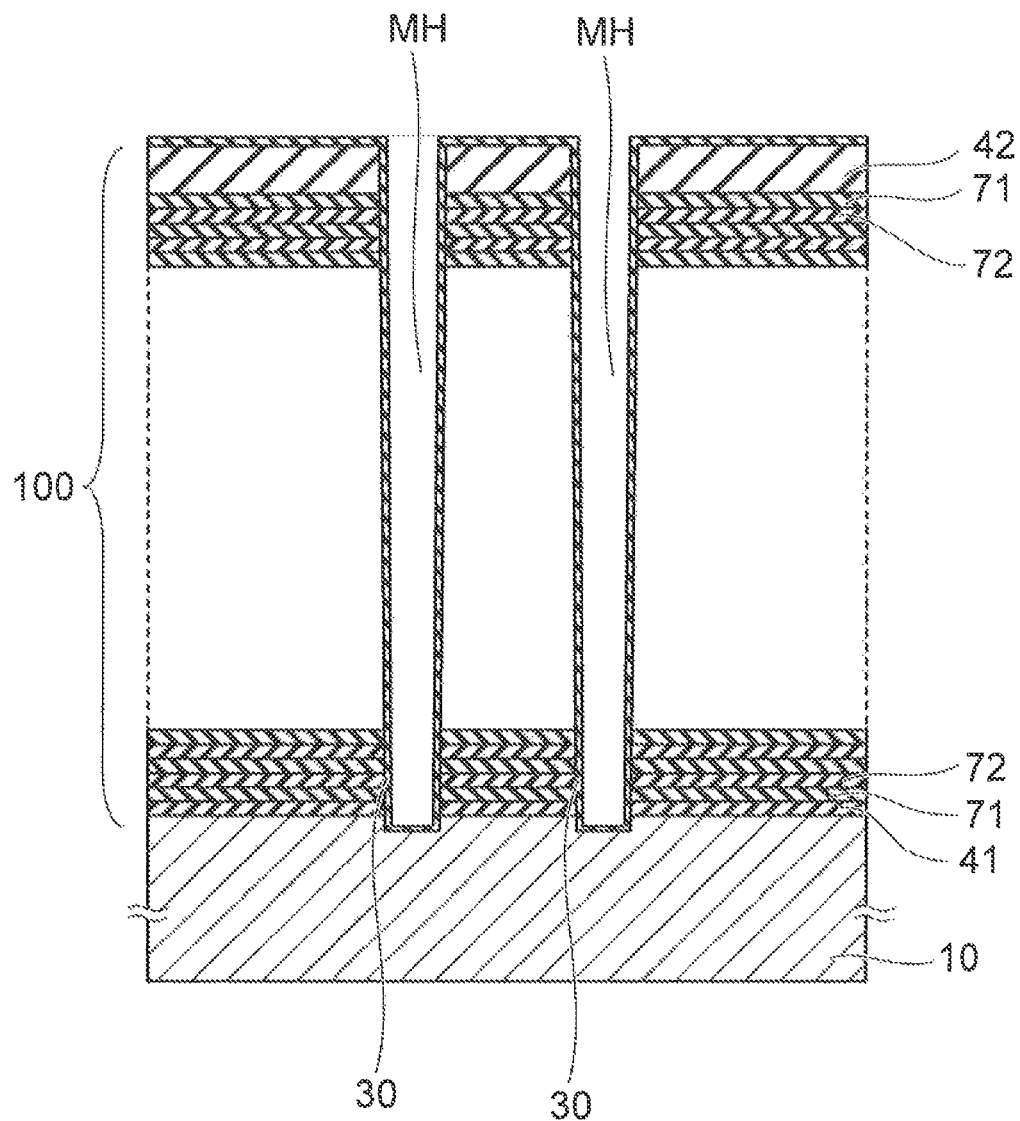

The films constituting the columnar part CL are formed in the memory hole MH. First, as shown in FIG. 6, a memory film 30 is formed on the side surface of the memory hole MH. The memory film 30 is formed also at the bottom of the memory hole MH. The block insulating film 33, the charge storage film 32, and the tunnel insulating film 31 shown in FIG. 3 are formed in this order conformally along the side surface and the bottom of the memory hole MH.

Figure 7:
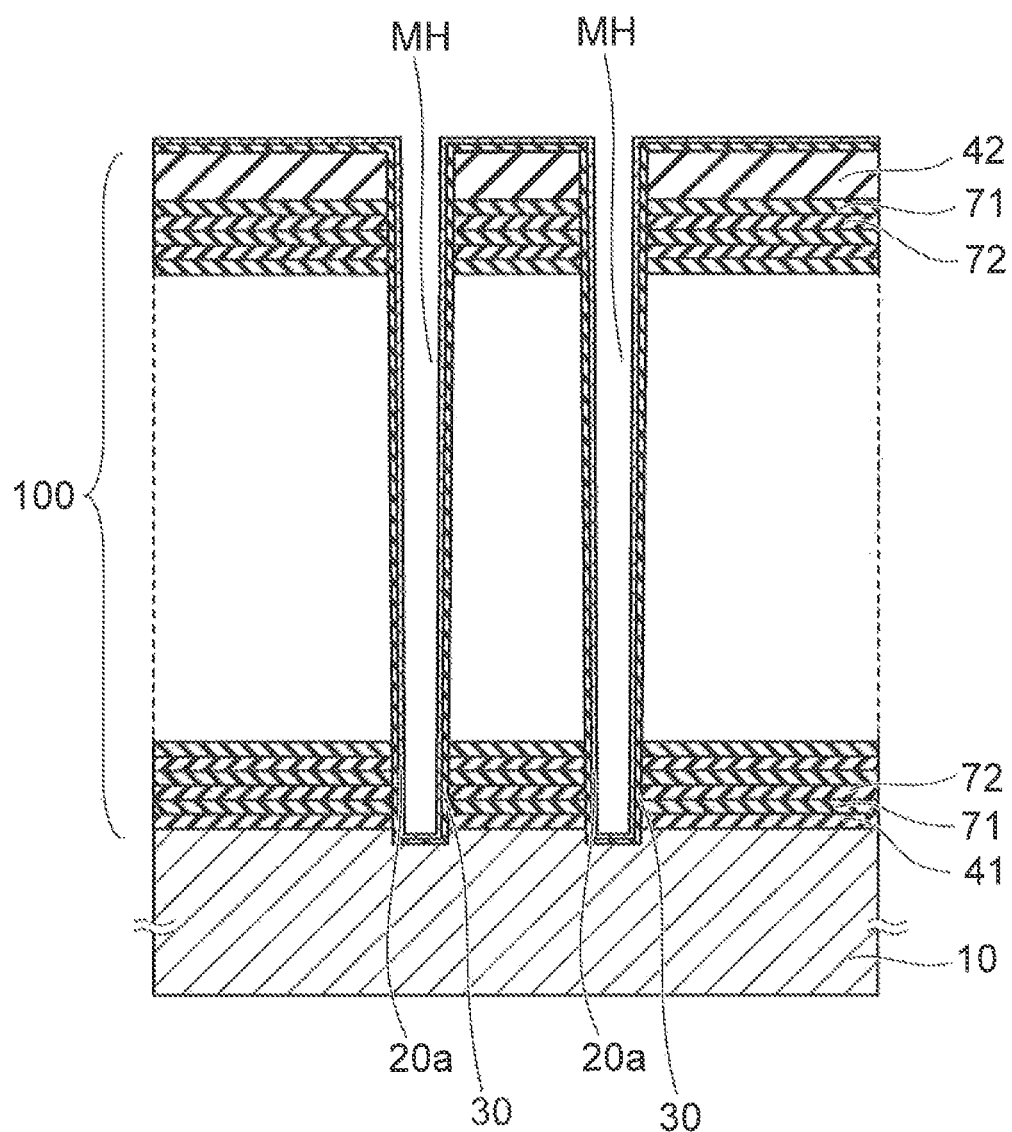

As shown in FIG. 7, a cover film 20a is formed inside the memory film 30. The cover film 20a is formed conformally along the side surface and the bottom of the memory hole MH.

Figure 8:
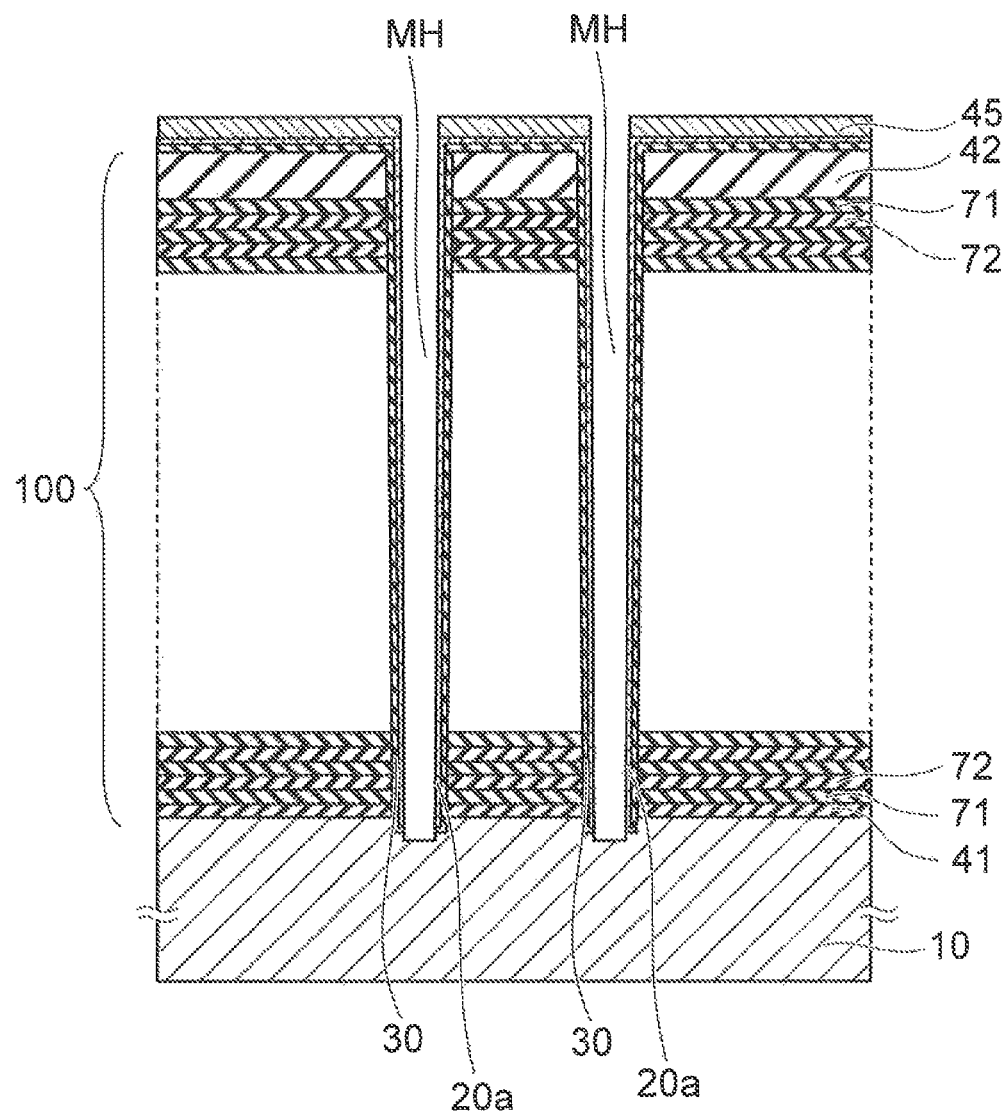

Then, as shown in FIG. 8, a mask layer 45 is formed on the upper surface of the stacked body 100. The cover film 20a and the memory film 30 deposited at the bottom of the memory hole MH are removed by RIE technique. In this RIE, the memory film 30 formed on the side surface of the memory hole MH is covered and protected with the cover film 20a, and not damaged by RIE.

Figure 9:
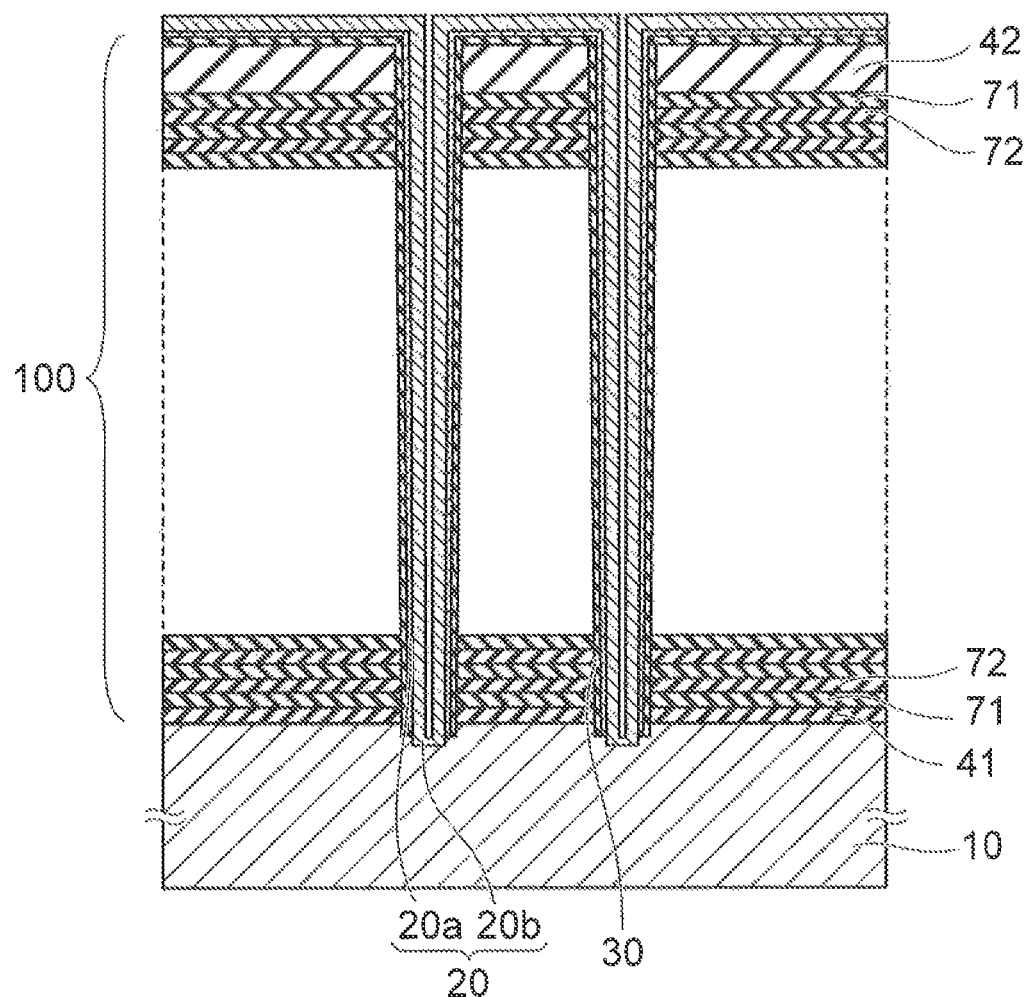

After removing the mask layer 45, as shown in FIG. 9, a semiconductor film 20b is formed in the memory hole MH. The semiconductor film 20b is formed on the side surface of the cover film 20a and at the bottom of the memory hole MH where the substrate 10 is exposed.

The cover film 20a and the semiconductor film 20b are formed as e.g. an amorphous silicon film, and then crystallized into a polycrystalline silicon film by heat treatment. The cover film 20a and the semiconductor film 20b constitute the aforementioned semiconductor body 20.

Figure 10:
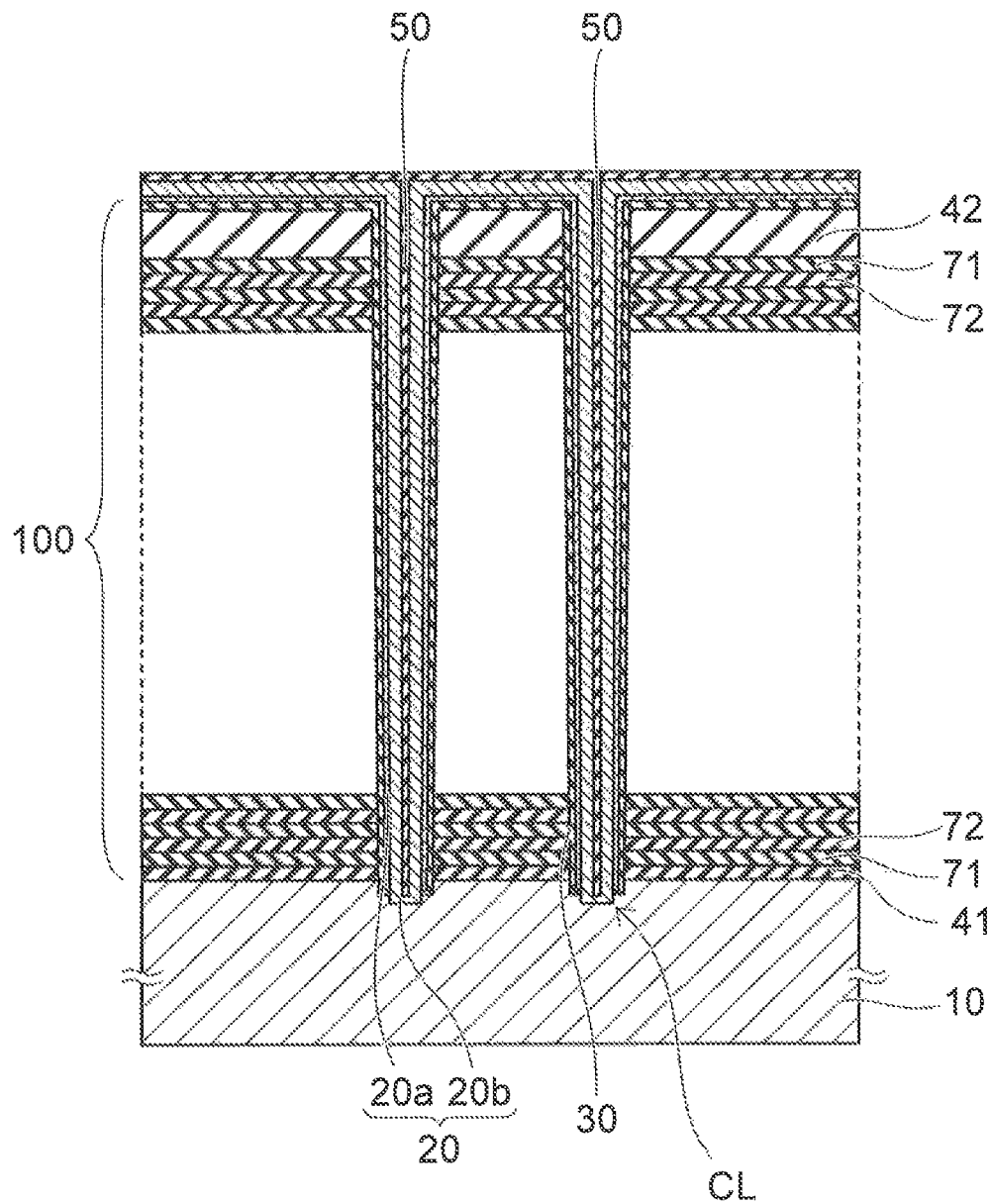
Figure 11:
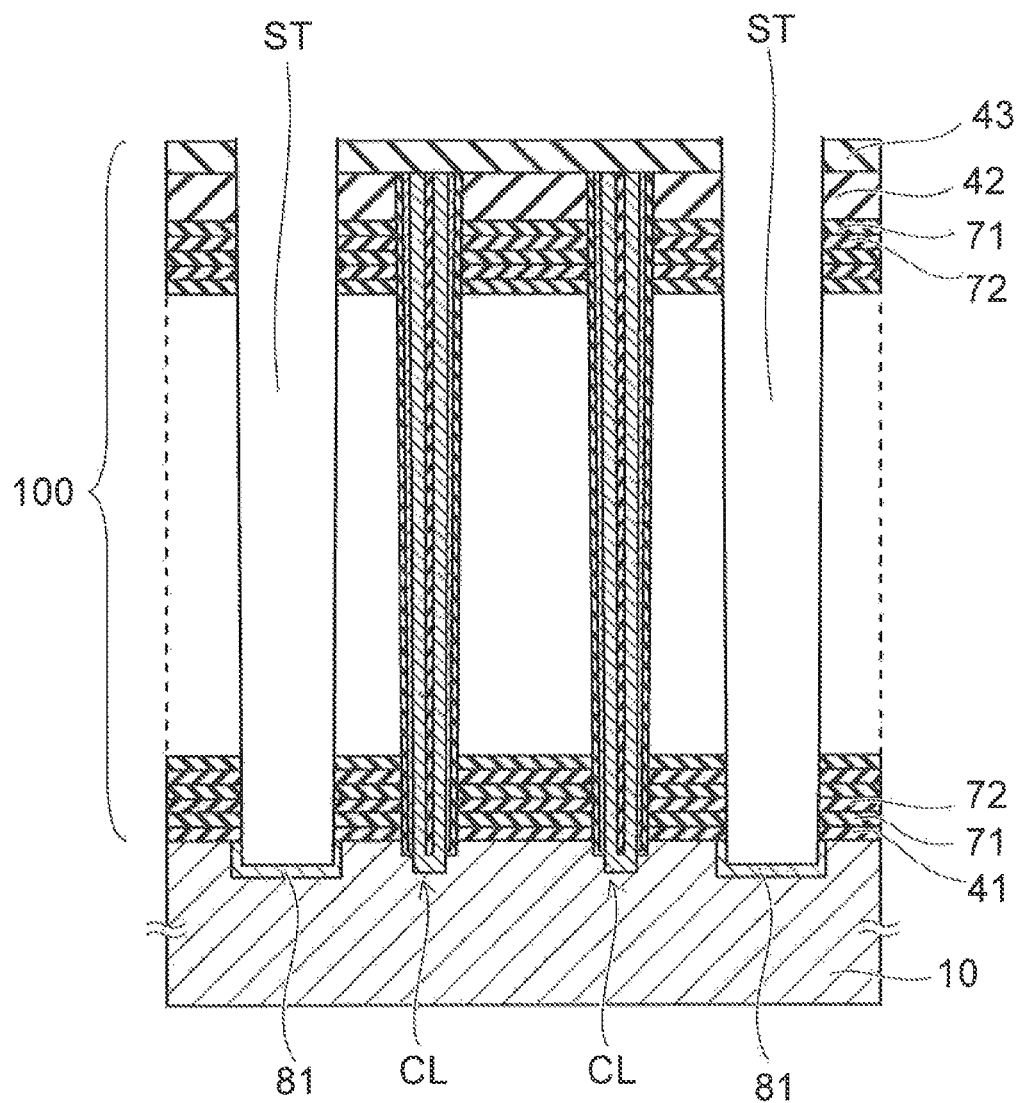

As shown in FIG. 10, a core film 50 is formed inside the semiconductor film 20b. The films deposited on the insulating film 42 shown in FIG. 10 are removed by chemical mechanical polishing (CMP) or etch-back. Then, as shown in FIG. 11, an insulating film 43 is formed on the insulating film 42. The insulating film 43 covers the upper end of the columnar part CL.

Then, by RIE technique using a mask, not shown, a plurality of slits ST are formed in the stacked body 100 including the insulating film 43, the insulating film 42, the sacrificial layers 71, the insulating layers 72, and the insulating film 41. The slit ST penetrates through the stacked body 100 to the substrate 10. The slit ST extends in the depth direction of the page of FIG. 11 (X-direction in FIG. 1).

Impurity is implanted by ion implantation technique into the substrate 10 exposed at the bottom of the slit ST. Thus, a p-type or n-type semiconductor region 81 is formed in the surface of the substrate 10 at the bottom of the slit ST.

Next, the sacrificial layer 71 is removed with an etchant or etching gas supplied through the slit ST. For instance, the silicon nitride layer as the sacrificial layer 71 is removed with an etchant containing phosphoric acid.

Figure 12:
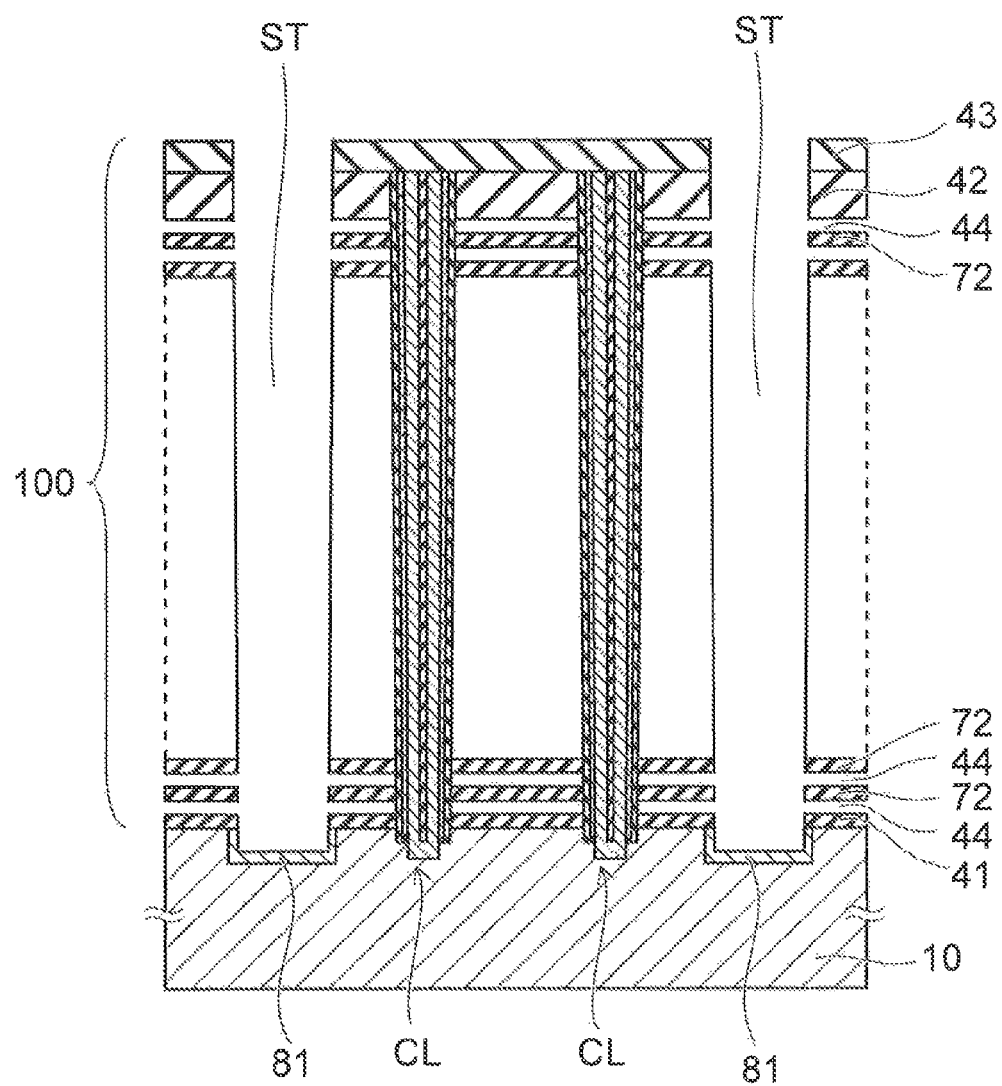
Figure 17A:
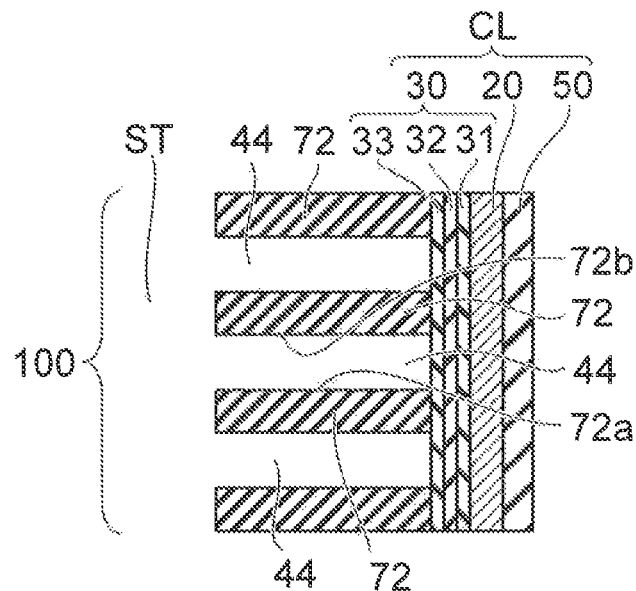

As shown in FIGS. 12 and 17A, an air gap 44 is formed between the vertically adjacent insulating layers 72 by the removal of the sacrificial layer 71. As shown in FIG. 12, the air gap 44 is formed also between the insulating film 41 and the lowermost insulating layer 72, and between the uppermost insulating layer 72 and the insulating film 42.

The plurality of insulating layers 72 stacked with the air gap 44 are supported by the columnar part CL. The lower end of the columnar part CL is supported by the substrate 10. The upper end of the columnar part CL is supported by the insulating film 42 and the insulating film 43.

As shown in FIG. 17A, the upper surface 72a and the lower surface 72b of the insulating layer 72 and the side surface of the columnar part CL (side surface of the block insulating film 33) are exposed to the air gap 44.

Figure 13:
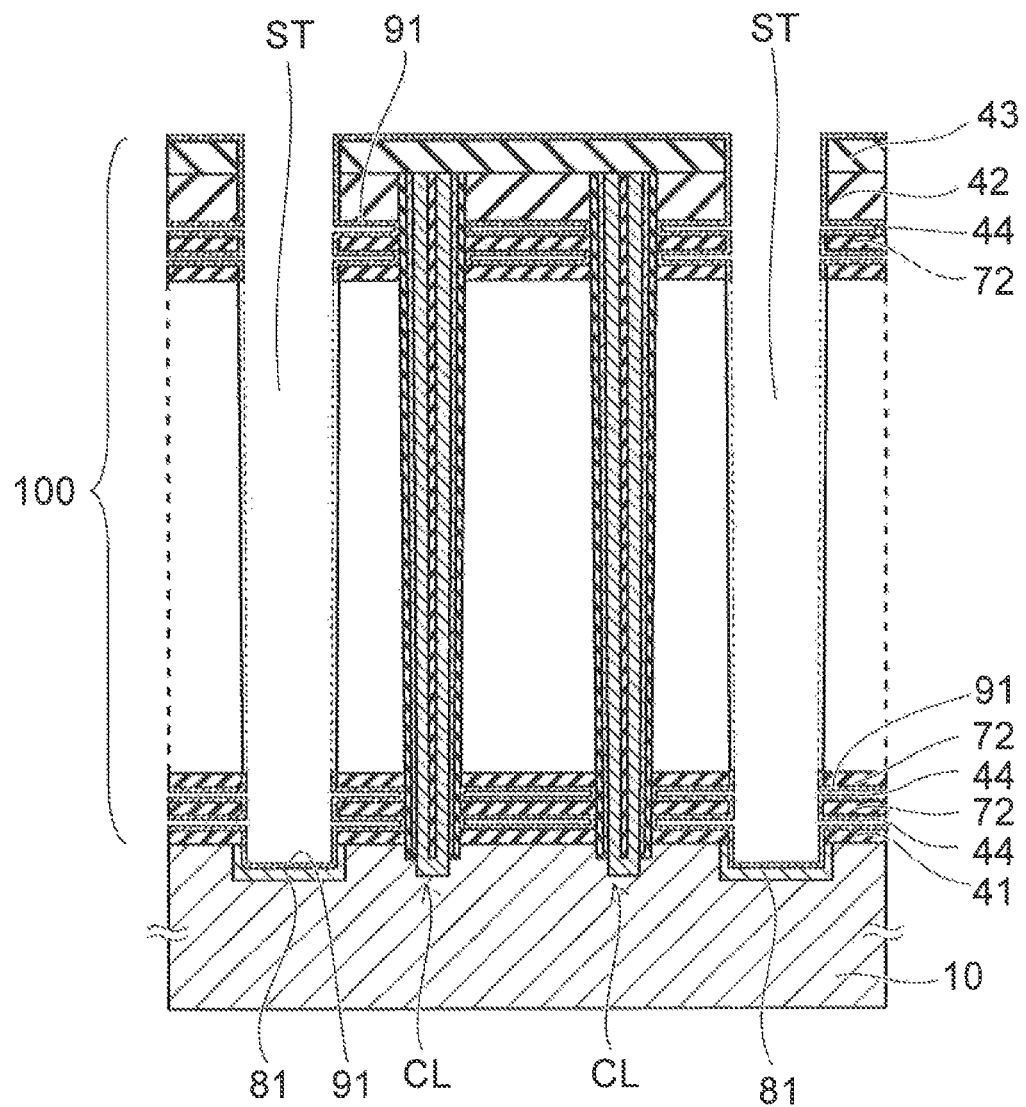
Figure 17B:
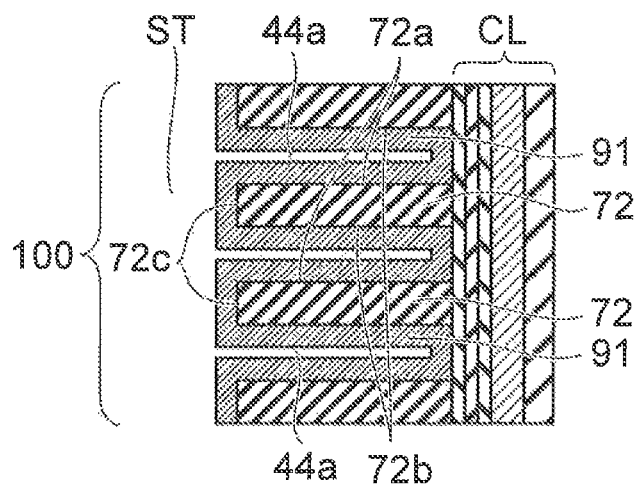

Next, as shown in FIGS. 13 and 17B, a silicon film 91 is formed in the air gap 44. The silicon film 91 is formed by e.g. chemical vapor deposition (CVD) technique. The source gas is supplied to the air gap 44 through the slit ST. Before forming the silicon film 91, an insulating film may be formed on the inner surface of the air gap 44 so as to serve a charge blocking function in cooperation with the block insulating film 33 exposed at the side surface of the air gap 44. Alternatively, the memory film 30 may be configured so that the insulating film constituting the block insulating film 33 is not entirely formed in the memory hole MH but formed on the inner surface of the air gap 44.

As shown in FIG. 17B, the silicon film 91 is formed on the upper surface 72a of the insulating layer 72 (lower surface side of the air gap 44), the lower surface 72b of the insulating layer 72 (upper surface side of the air gap 44), and the side surface of the columnar part CL (side surface side of the air gap 44 different from the slit ST side), in the air gap 44. The silicon film 91 is formed also on the side surface 72c of the insulating layer 72 exposed to the slit ST. The silicon film 91 is formed conformally and continuously along the side surface 72c of the insulating layer 72, the lower surface 72b of the insulating layer 72 (upper surface side of the aft gap 44), the side surface of the columnar part CL (side surface side of the air gap 44), and the upper surface 72a of the insulating layer 72 (lower surface side of the air gap 44). As shown in FIG. 13, the silicon film 91 is formed also at the bottom of the slit ST.

The film thickness of the silicon film 91 is thinner than half the height of the air gap 44 (distance between the vertically adjacent insulating layers 72). Thus, the air gap 44 is not filled with the silicon film 91. As shown in FIG. 17B, part 44a of the air gap 44 (hereinafter simply referred to as air gap 44a) remains between the silicon film 91 formed on the lower surface 72b of the insulating layer 72 and the silicon film 91 formed on the upper surface 72a of the insulating layer 72.

In the example shown in FIG. 17B, the opening on the slit ST side of the air gap 44a left between the insulating layers 72 is not occluded with the silicon film 91. The air gap 44a communicates with the slit ST.

Figure 17C:
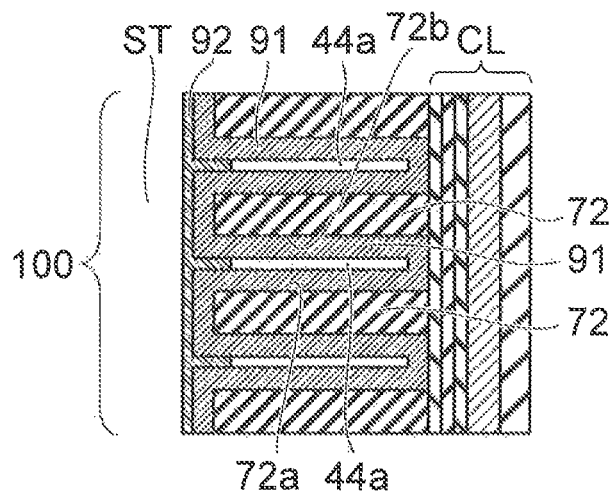

Next, as shown in FIG. 17C, a cover silicon film 92 made of the same material as the silicon film 91 is formed on the side surface of the slit ST. The cover silicon film 92 is formed by CVD technique using a source gas supplied to the slit ST. The cover silicon film 92 is deposited also at the bottom of the slit ST.

The cover silicon film 92 is formed on the side surface of the silicon film 91 exposed to the slit ST, and occludes the opening on the slit ST side of the air gap 44a. The opening on the slit ST side of the air gap 44a is occluded in the state in which the air gap 44a is maintained between the silicon film 91 formed on the upper surface 72a of the insulating layer 72 and the silicon film 91 formed on the lower surface 72b of the insulating layer 72.

Next, the cover silicon film 92 formed on the side surface of the slit ST and the silicon film 91 formed on the side surface of the slit ST are removed by e.g. wet etching technique with an alkaline chemical or RIE technique. At this time, the cover silicon film 92 and the silicon film 91 deposited at the bottom of the slit ST are also removed.

Etching of the silicon film 91 formed on the side surface of the slit ST proceeds with the opening on the slit ST side of the air gap 44a being occluded. This can suppress etching of the silicon film 91 between the insulating layers 72 by the etchant or etching gas intruding into the air gap 44a.

Figure 18A:
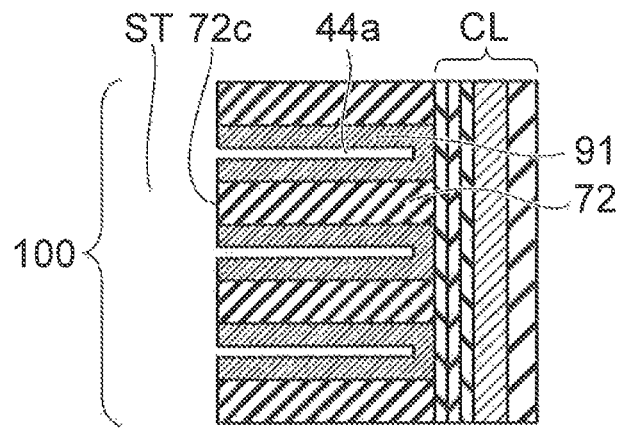

Thus, the cover silicon film 92 and the silicon film 91 formed on the side surface of the slit ST are removed. As shown in FIG. 18A, the side surface 72c of the insulating layer 72 is exposed to the slit ST. The cover silicon film 92 occluding the air gap 44a is removed, and the air gap 44a communicates with the slit ST. The silicon film 91 formed on the side surface 72c of the insulating layer 72 is removed. The silicon film 91 connected in the vertical direction (stacking direction of the stacked body 100) is disconnected. This breaks the physical connection between the silicon films 91 formed in the respective air gaps 44.

Figure 18B:
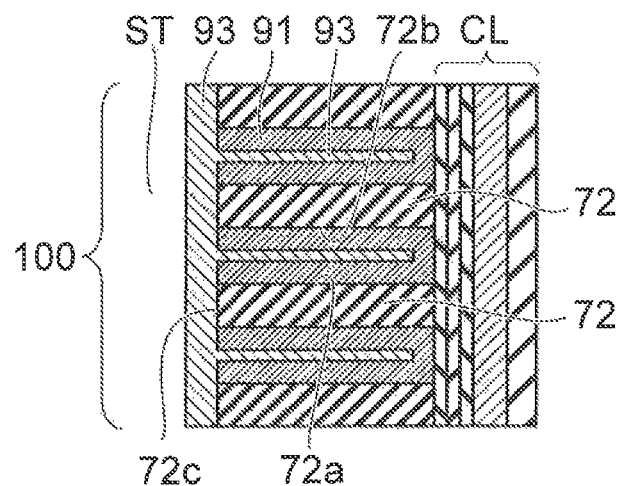

Next, as shown in FIG. 18B, a metal film 93 is formed on the side surface of the slit ST. For instance, a nickel film is formed as the metal film 93 by CVD technique or electroless plating technique.

The metal film 93 is formed on the side surface 72c of each insulating layer 72 along the side surface of the slit ST. Furthermore, part of the metal film 93 is formed also in the air gap 44a. The metal film 93 is formed between the silicon film 91 formed on the upper surface 72a of the insulating layer 72 and the silicon film 91 formed on the lower surface 72b of the insulating layer 72. The metal film 93 is formed also on the bottom of the slit ST.

Figure 14:
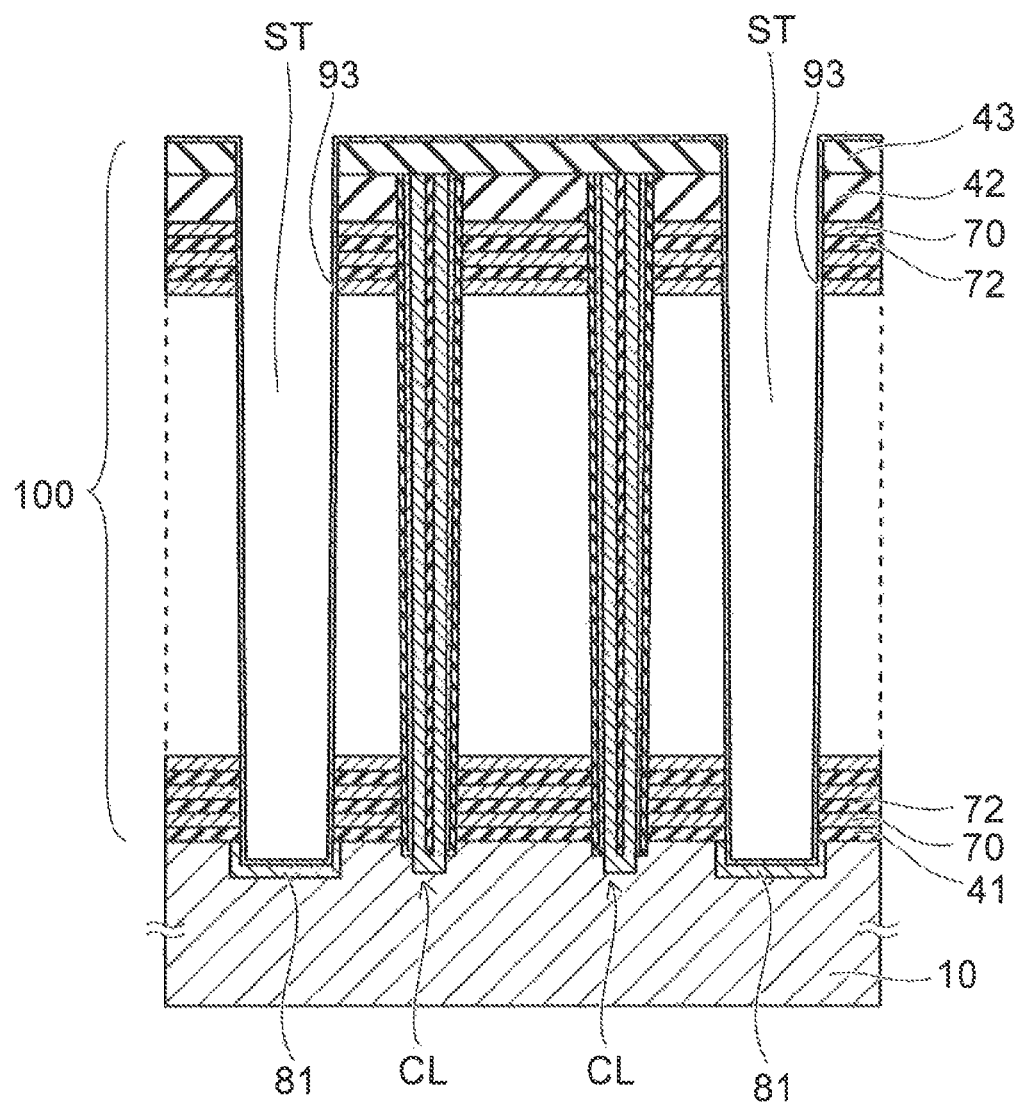
Figure 18C:
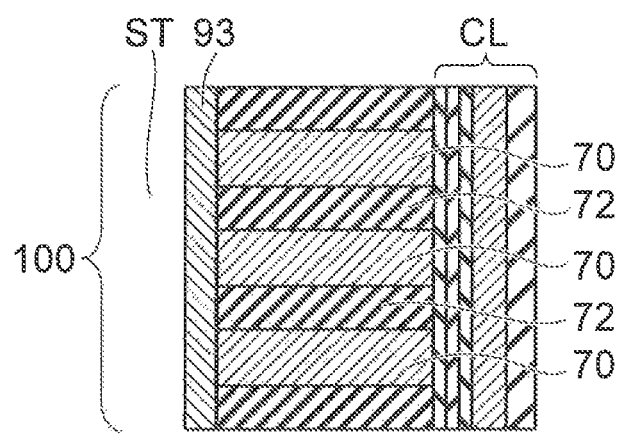

Next, thermal reaction is caused between the metal film 93 and the silicon film 91 by annealing treatment. As shown in FIGS. 14 and 18C, this thermal reaction forms a metal silicide layer 70 between the vertically adjacent insulating layers 72. As shown in FIG. 14, the metal silicide layer 70 is formed also between the insulating film 41 and the lowermost insulating layer 72, and between the uppermost insulating layer 72 and the insulating film 42.

For instance, a nickel silicide layer as the metal silicide layer 70 is formed by reaction between nickel in the nickel film as the metal film 93 and silicon in the silicon film 91.

In this annealing treatment, a metal silicide film (not shown in FIG. 14) is formed on the surface of the semiconductor region 81 by reaction between the metal film 93 formed at the bottom of the slit ST and the semiconductor region 81. This metal silicide film decreases the contact resistance between the semiconductor region 81 and the interconnect part LI.

As shown in FIG. 18B, the silicon film 91 is not interposed between the metal film 93 formed on the side surface of the slit ST and the side surface 72c of the insulating layer 72. Thus, no metal silicide is formed on the side surface 72c of the insulating layer 72. Accordingly, there is no short circuit between the vertically adjacent metal silicide layers 70 through such metal silicide. The unreacted metal film 93 remaining on the side surface of the slit ST is removed as described later. This electrically disconnects the vertically adjacent metal silicide layers 70 from each other.

Metal silicidation of the silicon film 91 involves volume expansion. The volume of the metal silicide layer 70 is made larger than the volume of the silicon film 91. An excessive volume expansion at this time may incur tilt or collapse of the stacked portion extending in the depth direction of the page between the slits ST in FIG. 14. That is, if the air gap 44 between the insulating layers 72 is completely filled with the silicon film 91, tilt or collapse of the aforementioned stacked portion may occur.

According to the embodiment, the air gap 44 between the vertically adjacent insulating layers 72 is not completely filled with the silicon film 91. As shown in FIG. 18A, the silicon film 91 is formed between the insulating layers 72 with the air gap 44a being left. As shown in FIG. 18B, the metal film 93 is formed in the air gap 44a. Annealing treatment is performed in this state to cause metal silicidation of the silicon film 91. Partial absence of the silicon film 91 between the vertically adjacent insulating layers 72 suppresses the amount of volume expansion at the time of metal silicidation of the silicon film 91. This can prevent tilt and collapse of the aforementioned stacked portion between the slits ST.

For instance, the nickel silicide layer as the metal silicide layer 70 primarily contains NiSi (nickel monosilicide) or $Ni_2Si$ (dinickel silicide). The composition of metal silicide can be controlled by the amount of silicon and metal supplied to the reaction, and the annealing treatment condition (e.g., temperature). Volume expansion at the time of forming metal silicide depends on the composition of metal silicide.

The volume expansion ratio is higher in turning silicon into $Ni_2Si$ than in turning silicon into NiSi. Thus, the height of the air gap 44a left between the silicon films 91 in forming the metal silicide layer 70 primarily containing $Ni_2Si$ is preferably larger than the height of the air gap 44a left between the silicon films 91 in forming the metal silicide layer 70 primarily containing NiSi. This height refers to the height along the stacking direction of the stacked body 100.

For instance, the height of the air gap 44a left between the silicon films 91 in forming the metal silicide layer 70 primarily containing $Ni_2Si$ is preferably 38% or more of the height of the original air gap 44 (distance between the vertically adjacent insulating layers 72). The height of the air gap 44a left between the silicon films 91 in forming the metal silicide layer 70 primarily containing NiSi is preferably 17% or more of the height of the original air gap 44 (distance between the vertically adjacent insulating layers 72).

From the viewpoint of resistance reduction, preferably, the air gap 44 between the insulating layers 72 is completely filled with the metal silicide layer 70 without leaving voids, unreacted silicon film 91, and unreacted metal film 93 in the air gap 44 between the insulating layers 72. For instance, in the case of nickel silicide, NiSi has lower resistance than $Ni_2Si$. Thus, preferably, the air gap 44 is completely filled with NiSi. This is preferable also from the viewpoint of easy process control because NiSi has lower volume expansion ratio than Ni$_2$Si as described above.

The volume of the NiSi film formed by reaction between the silicon film and the nickel film tends to be smaller than the total of the volume of the silicon film and the volume of the nickel film before the reaction. Thus, it may be difficult to form a metal silicide layer (NiSi layer) 70 without voids between the insulating layers 72 only from the metal film (nickel film) 93 formed in the air gap 44a.

However, according to the embodiment, in the aforementioned annealing treatment, the metal (nickel) in the metal film (nickel film) 93 formed on the side surface of the slit ST also diffuses into the silicon film 91 between the insulating layers 72. Thus, the metal silicide layer (NiSi layer) 70 can be formed without voids between the insulating layers 72.

The metal film 93 does not need to be formed in the air gap 44a between the silicon films 91. Alternatively, the metal film 93 formed in the air gap 44a may include voids. Even in these cases, the metal silicide layer 70 can be formed without voids between the insulating layers 72 by appropriately controlling the film thickness of the metal film 93 formed on the side surface of the slit ST. Thickening the metal film 93 formed on the side surface of the slit ST increases the amount of metal diffusion from the metal film 93 into the silicon film 91 between the insulating layers 72. This enables metal silicidation without voids.

Unreacted metal film 93 remains on the side surface of the slit ST. The unreacted metal film 93 is removed. For instance, the nickel film (metal film 93) unreacted with silicon is removed with sulfuric acid/hydrogen peroxide mixture supplied to the slit ST.

Figure 19:
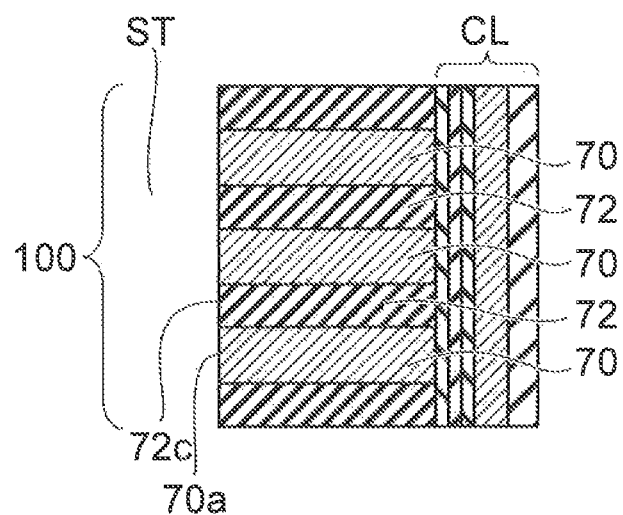

Thus, the unreacted metal film 93 is removed. As shown in FIG. 19, the side surface 70a of each metal silicide layer 70 and the side surface 72c of each insulating layer 72 are exposed to the slit ST.

Figure 15:
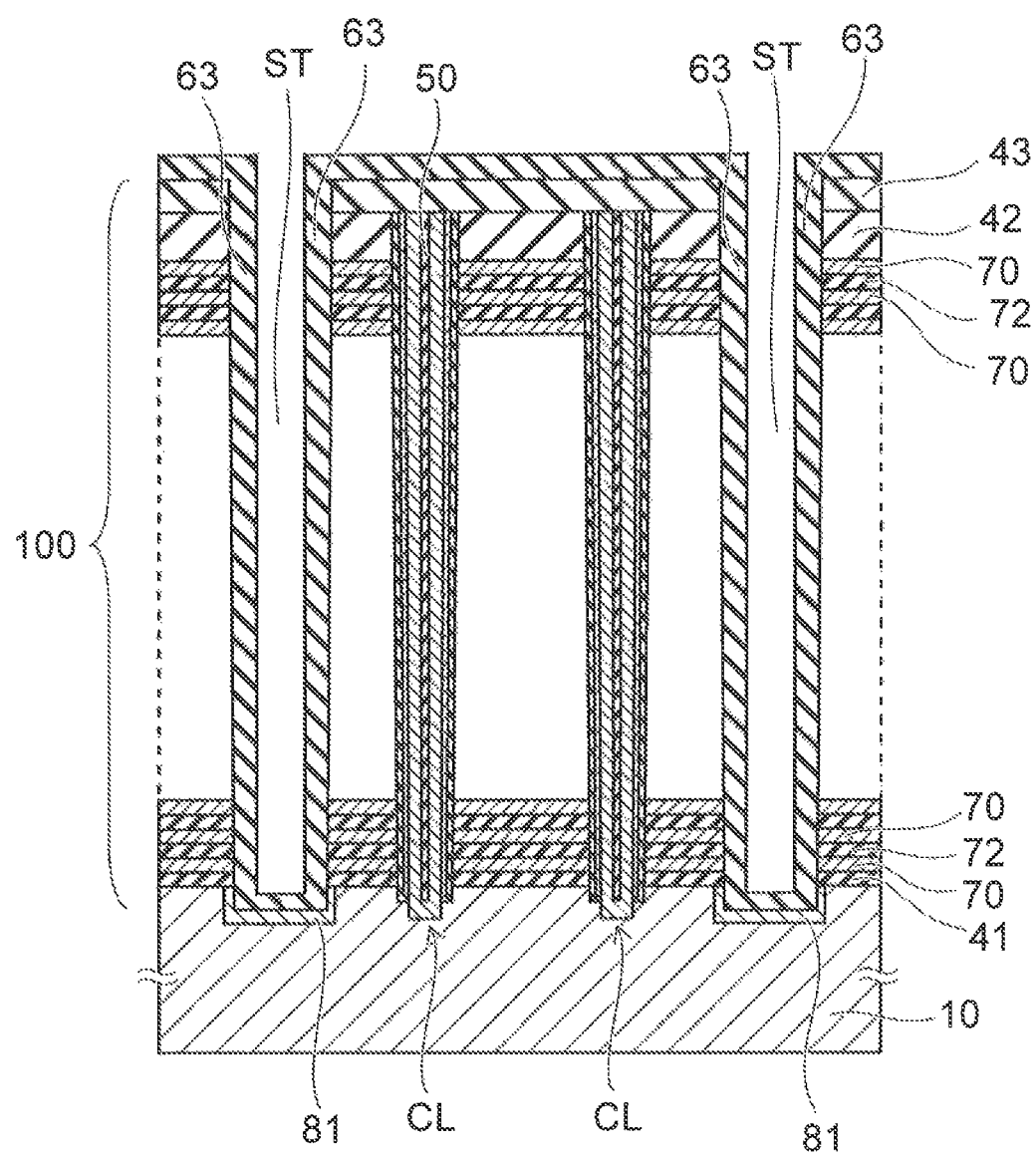
Figure 16:
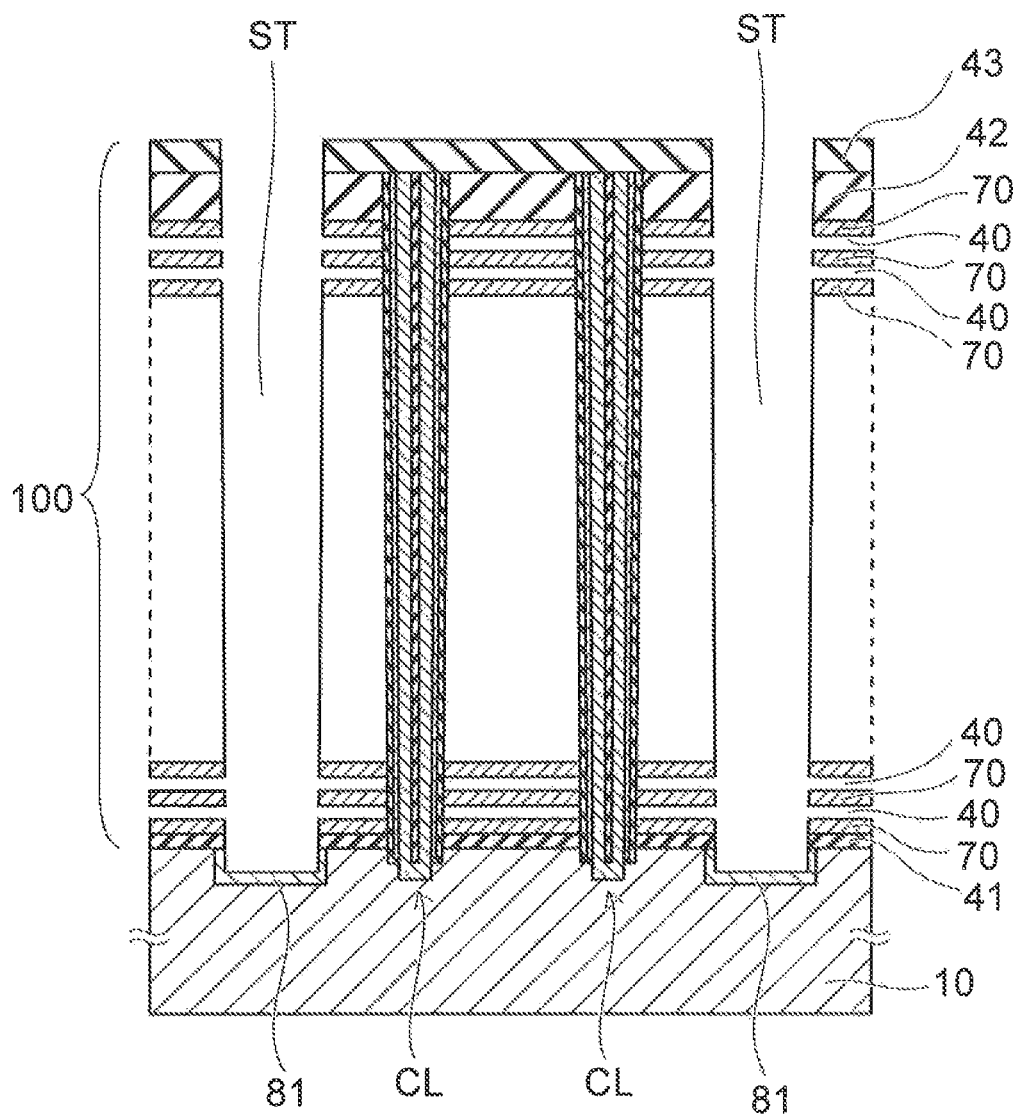

As shown in FIG. 15, an insulating film 63 is formed on the side surface of the slit ST to which the side surface 70a of the metal silicide layer 70 and the side surface 72c of the insulating layer 72 are exposed. The insulating film 63 is formed also at the bottom of the slit ST.

The insulating film 63 formed at the bottom of the slit ST is removed by RIE technique. Then, as shown in FIG. 2, an interconnect part LI is buried in the slit ST. The lower end of the interconnect part LI is connected to the substrate 10 via the semiconductor region 81. Then, the bit lines BL, the source line SL and the like shown in FIG. 1 are formed.

In the aforementioned example step shown in FIG. 17C, after forming the silicon film 91, a cover silicon film 92 is formed by an additional film formation process to occlude the opening of the air gap 44a.

Figure 20:
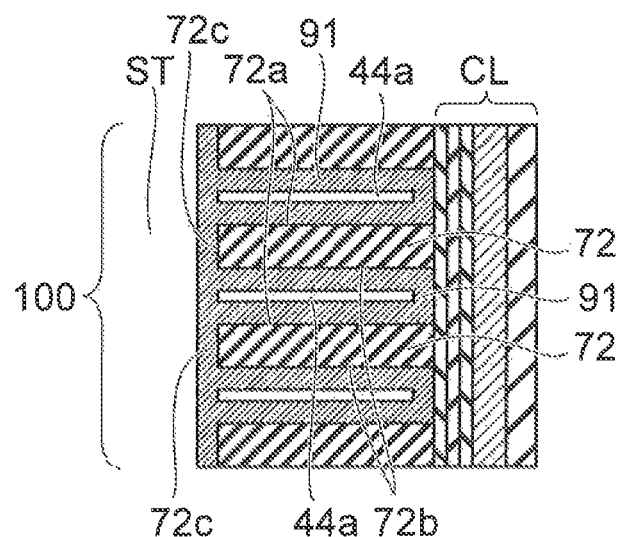

Alternatively, as shown in FIG. 20, the opening of the air gap 44a can also be occluded with the silicon film 91 by controlling the condition for forming the silicon film 91. The silicon film 91 covering the corner of the side surface 72c of the insulating layer 72 and the lower surface 72b of the insulating layer 72 (upper surface side of the air gap 44), and the silicon film 91 covering the corner of the side surface 72c of the insulating layer 72 and the upper surface 72a of the insulating layer 72 (lower surface side of the air gap 44), are vertically integrated to occlude the opening of the air gap 44a.

After removing the unreacted metal film 93 in the slit ST shown in FIG. 14, the insulating layer 72 between the metal silicide layers 70 may be removed with an etchant or etching gas supplied through the slit ST. For instance, the silicon oxide layer as the insulating layer 72 is removed with an etchant containing hydrofluoric acid.

Thus, the insulating layer 72 is removed. As shown in FIG. 15, an air gap 40 is formed between the metal silicide layers 70. Then, an interconnect part LI is formed via the insulating film 63 in the slit ST.

The air gap 40 is formed between the metal silicide layers 70, which are control gates of the memory cells MC adjacent in the stacking direction. This can reduce the interconnect capacitance between the vertically adjacent metal silicide layers 70 and enables fast operation of the memory cell MC. Furthermore, this can suppress interference between adjacent cells such as threshold variation due to capacitive coupling between the vertically adjacent metal silicide layers 70.

Next, an alternative example of the method for forming the metal silicide layer 70 is described with reference to FIGS. 21A to 23.

Figure 21A:
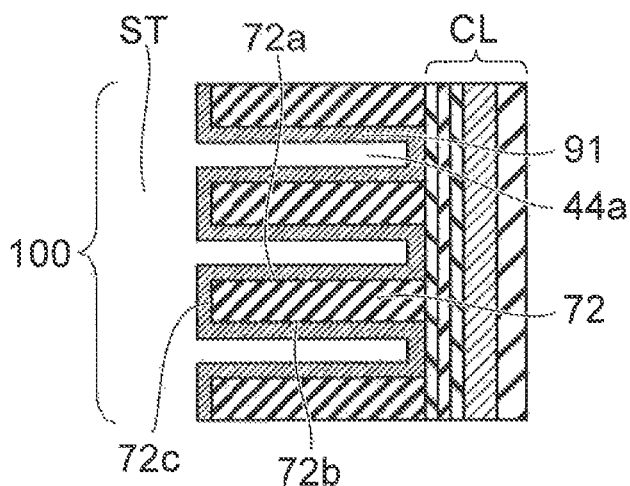

As shown in FIG. 21A, the method is performed similarly to the above embodiment until the step for forming a silicon film 91 in the air gap 44 between the insulating layers 72. The silicon film 91 is formed conformally and continuously along the side surface 72c of the insulating layer 72, the lower surface 72b of the insulating layer 72 (upper surface side of the air gap 44), the side surface of the columnar part CL (side surface side of the air gap 44), and the upper surface 72a of the insulating layer 72 (lower surface side of the air gap 44).

Also in this case, the air gap 44 is not filled with the silicon film 91. An air gap 44a remains between the silicon film 91 formed on the lower surface 72b of the insulating layer 72, and the silicon film 91 formed on the upper surface 72a of the insulating layer 72. The opening on the slit ST side of the air gap 44a is not occluded with the silicon film 91. The air gap 44a communicates with the slit ST.

Figure 21B:
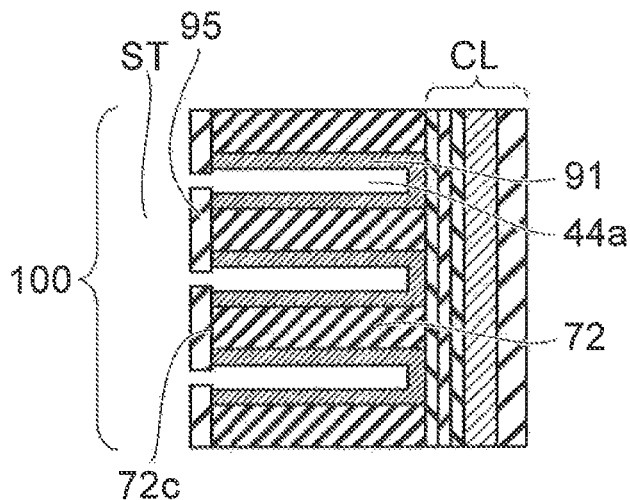

Next, the silicon film 91 exposed in the slit ST and formed along the side surface of the slit ST is oxidized. The silicon film 91 formed on the side surface 72c of the insulating layer 72, the silicon film 91 formed at the corner of the upper surface 72a and the side surface 72c of the insulating layer 72, and the silicon film 91 formed at the corner of the lower surface 72b and the side surface 72c of the insulating layer 72 are oxidized. Thus, as shown in FIG. 21B, a silicon oxide film 95 is formed along the side surface of the slit ST. The silicon oxide film 95 is vertically disconnected at the position opposed to the opening of the air gap 44a.

Figure 23:
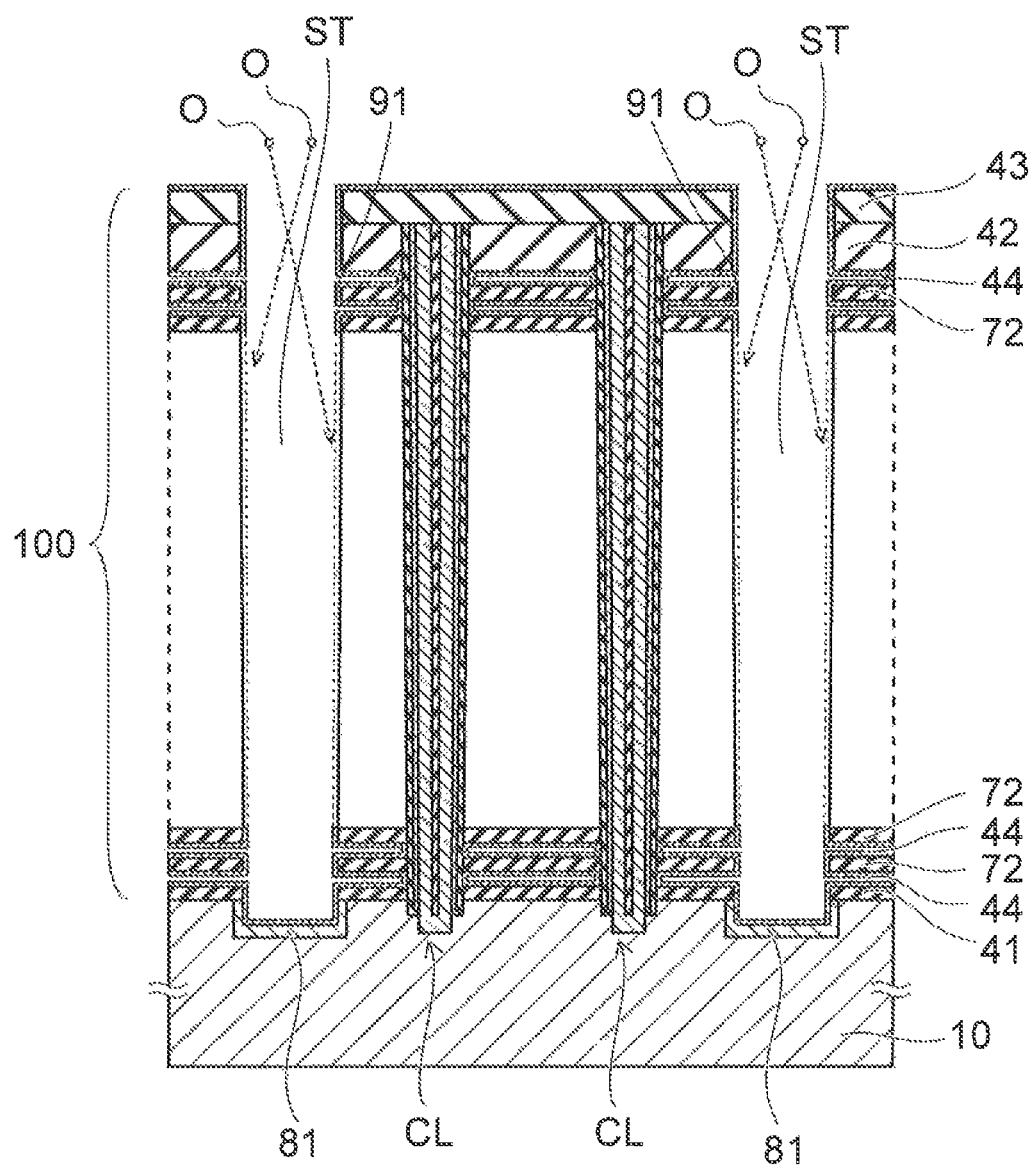

For instance, as shown in FIG. 23, oxygen ions O are introduced into the silicon film 91 on the side surface of the slit ST. By subsequent annealing treatment, a silicon oxide film 95 is formed on the side surface of the slit ST. Oxygen ions O are not introduced into the air gap 44a. Thus, the silicon film 91 between the vertically adjacent insulating layers 72 is not oxidized.

The silicon oxide film 95 is formed on the side surface 72c of the insulating layer 72. This disconnects the silicon film 91 connected in the vertical direction (stacking direction of the stacked body 100).

In the case of etching the silicon film 91 formed on the side surface 72c of the insulating layer 72 by e.g. RIE technique, the gas used in this etching may be adsorbed on the surface of the silicon film 91 formed near the opening of the air gap 44a. This adsorbed gas component may hamper the diffusion of metal from the metal film 93 formed on the side surface of the slit ST into the silicon film 91 formed on the upper surface 72a of the insulating layer 72 and the silicon film 91 formed on the lower surface 72b of the insulating layer 72. This may prevent complete metal silicidation of the silicon film 91 between the insulating layers 72, and prevent resistance reduction of the control gate of the memory cell MC and the select transistor STD, STS.

According to the embodiment, the silicon film 91 formed on the side surface 72c of the insulating layer 72 is oxidized as shown in FIG. 21B. Thus, there is no need of the process for etching the silicon film 91 on the side surface 72c. This can avoid gas adsorption hampering the metal silicidation of the silicon film 91.

Figure 21C:
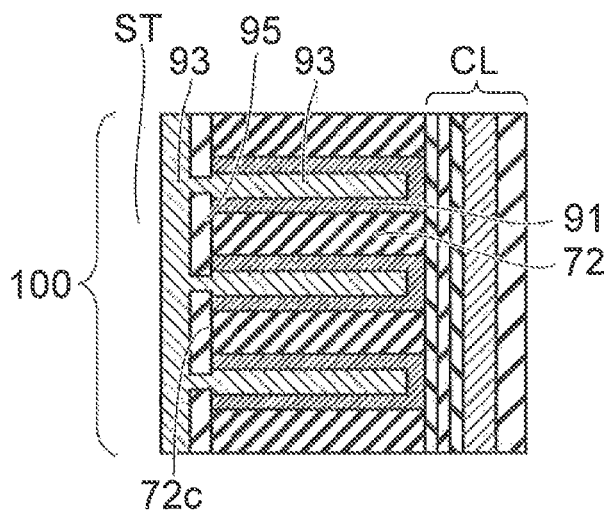

Next, as shown in FIG. 21C, a metal film 93 is formed on the side surface of the slit ST. For instance, a nickel film is formed as the metal film 93 by CVD technique or electroless plating technique.

The metal film 93 covers the side surface 72c of the insulating layer 72 via the silicon oxide film 95. Furthermore, part of the metal film 93 is formed also in the air gap 44a. The metal film 93 is formed between the silicon film 91 formed on the upper surface 72a of the insulating layer 72 and the silicon film 91 formed on the lower surface 72b of the insulating layer 72.

Figure 22A:
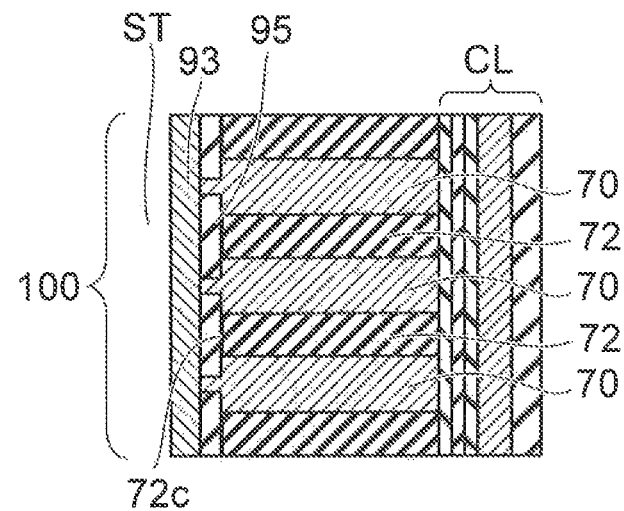

Next, thermal reaction is caused between the metal film 93 and the silicon film 91 by annealing treatment. As shown in FIG. 22A, this thermal reaction forms a metal silicide layer 70 between the vertically adjacent insulating layers 72. For instance, a nickel silicide layer as the metal silicide layer 70 is formed by reaction between nickel in the nickel film as the metal film 93 and silicon in the silicon film 91. At this time, metal diffuses also from the metal film 93 formed on the side surface of the slit ST into the silicon film 91 between the insulating layers 72. When the film thickness of the metal film 93 formed on the side surface of the slit ST is appropriately set (thickened), the metal film 93 in the air gap 44a may not be formed. Alternatively, the metal film 93 in the air gap 44a may include voids.

As shown in FIG. 21C, the silicon oxide film 95 is formed between the metal film 93 formed on the side surface of the slit ST and the side surface 72c of the insulating layer 72. And the silicon film 91 is not interposed between the metal film 93 formed on the side surface of the slit ST and the side surface 72c of the insulating layer 72. No metal silicide is formed on the portion opposed to the side surface 72c of the insulating layer 72. Accordingly, there is no short circuit between the vertically adjacent metal silicide layers 70 through such metal silicide. The unreacted metal film 93 remaining on the side surface of the slit ST is removed as described later. This electrically disconnects the vertically adjacent metal silicide layers 70 from each other.

Also in this example, the air gap 44 between the vertically adjacent insulating layers 72 is not completely filled with the silicon film 91. As shown in FIG. 21A, the silicon film 91 is formed between the insulating layers 72 with the air gap 44a being left. As shown in FIG. 21C, the metal film 93 is formed in the air gap 44a. Annealing treatment is performed in this state to cause metal silicidation of the silicon film 91. Partial absence of the silicon film 91 between the vertically adjacent insulating layers 72 suppresses the amount of volume expansion at the time of metal silicidation of the silicon film 91. This can prevent tilt and collapse of the stacked portion between the slits ST.

Then, unreacted metal film 93 remaining on the side surface of the slit ST is removed. For instance, the nickel film (metal film 93) unreacted with silicon is removed with sulfuric acid/hydrogen peroxide mixture supplied to the slit ST.

Figure 22B:
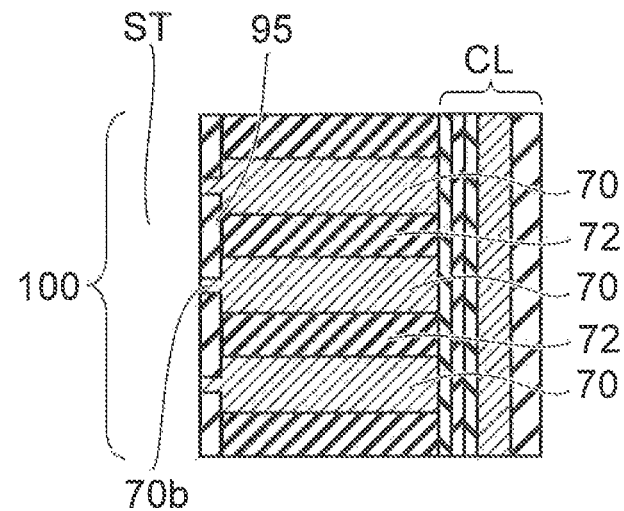

The unreacted metal film 93 is removed. As shown in FIG. 22B, the silicon oxide film 95 and the end part 70b on the slit ST side of the metal silicide layer 70 are exposed to the slit ST. Then, an interconnect part LI is formed via an insulating film 63 in the slit ST.

The end part 70b on the slit ST side of the metal silicide layer 70 is formed between the vertically adjacent silicon oxide films 95. As shown in FIG. 21B, the distance between the vertically adjacent silicon oxide films 95 may be made smaller than the height of the air gap 44a by volume expansion associated with the oxidation of the silicon film 91 on the side surface of the slit ST. In this case, the end part 70b of the metal silicide layer 70 (the portion on the slit ST side) is made thinner than the other portion of the metal silicide layer 70, i.e., the portion between the insulating layers 72, and the portion on the columnar part CL side.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor device, comprising:
    forming a stacked body above a substrate, the stacked body including a plurality of first layers and a plurality of second layers, the first and second layers including a first layer and a second layer alternately stacked;
    forming a slit extending in a stacking direction in the stacked body;
    removing the first layers which are alternately stacked and exposed to the slit by etching through the slit to form an air gap between the second layers, the air gap communicating with the slit;
    forming a silicon film on an upper surface side of the air gap, a lower surface side of the air gap, and a side surface side of the air gap, the side surface side being different from the slit side, while leaving part of the air gap between the silicon film formed on the upper surface side of the air gap and the silicon film formed on the lower surface side of the air gap;
    after the forming the silicon film, forming a metal film on a side surface of the slit;
    forming a plurality of metal silicide layers between the second layers by causing reaction between the metal film and the silicon film; and
    removing unreacted part of the metal film formed on the side surface of the slit.

2. The method according to claim 1, wherein the metal film is formed also in the part of the air gap.

3. The method according to claim 1, wherein the silicon film is not interposed between a side surface on the slit side of the second layer and the metal film.

4. The method according to claim 3, wherein
    the silicon film is formed conformally along the side surface of the second layer, the upper surface side of the air gap, the lower surface side of the air gap, and the side surface side of the air gap, and
    before the forming the metal film, the silicon film formed on the side surface of the second layer is removed.

5. The method according to claim 4, wherein the silicon film formed on the side surface of the second layer is removed after occluding an opening on the slit side of the part of the air gap with a cover silicon film.

6. The method according to claim 4, wherein the silicon film covering a corner of the side surface of the second layer and the upper surface side of the air gap, and the silicon film covering a corner of the side surface of the second layer and the lower surface side of the air gap occlude an opening on the slit side of the part of the air gap.

7. The method according to claim 3, wherein
the silicon film is formed conformally along the side surface of the second layer, the upper surface side of the air gap, the lower surface side of the air gap, and the side surface side of the air gap, and
before the forming the metal film, the silicon film exposed in the slit and formed along the side surface of the slit is oxidized.

8. The method according to claim 7, wherein the metal film covers the side surface of the second layer via an oxidized portion of the silicon film.

9. The method according to claim 7, wherein the silicon film is oxidized by introducing oxygen ions into the slit.

10. The method according to claim 7, wherein a portion on the slit side of the metal silicide layer is thinner than another portion of the metal silicide layer.

11. The method according to claim 1, wherein the metal film is a nickel film, and the metal silicide layer is a nickel silicide layer.

12. The method according to claim 11, wherein the nickel silicide layer primarily contains NiSi.

13. The method according to claim 12, wherein a height of the part of the air gap is 17% or more of a height of the air gap.

14. The method according to claim 11, wherein the nickel silicide layer primarily contains $Ni_2Si$.

15. The method according to claim 14, wherein a height of the part of the air gap is 38% or more of a height of the air gap.

16. The method according to claim 1, further comprising:
forming a columnar part in the stacked body, the columnar part including a semiconductor body extending in the stacking direction and a charge storage part provided between the semiconductor body and the first layer.

17. The method according to claim 1, wherein the first layer is a silicon nitride layer, and the silicon nitride layer is removed with an etchant containing phosphoric acid.

18. The method according to claim 1, further comprising:
after the removing the unreacted part of the metal film, removing the second layers by etching through the slit to form an air gap between the metal silicide layers.

19. The method according to claim 18, wherein the second layer is a silicon oxide layer, and the silicon oxide layer is removed with an etchant containing hydrofluoric acid.

20. The method according to claim 16, further comprising:
after the removing the unreacted part of the metal film, forming an insulating film on the side surface of the slit; and
forming an interconnect part via the insulating film in the slit.

* * * * *